(12) United States Patent
Wang et al.

(10) Patent No.: US 11,728,368 B2
(45) Date of Patent: Aug. 15, 2023

(54) SEMICONDUCTOR PACKAGING METHOD AND SEMICONDUCTOR DEVICE BASED ON MOLDING PROCESS

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Zhenyu Chen, Ningbo (CN); Heng Jiang, Ningbo (CN); Nan Guo, Ningbo (CN)

(73) Assignee: NINGBO SUNNY OPOTECH CO., LTD., Ningbo (CN)

( * ) Notice: Subject to any disclaimer, the term of this patent is extended or adjusted under 35 U.S.C. 154(b) by 219 days.

(21) Appl. No.: 17/352,961

(22) Filed: Jun. 21, 2021

(65) Prior Publication Data
US 2021/0313385 A1  Oct. 7, 2021

Related U.S. Application Data

(63) Continuation of application No. 16/578,014, filed on Sep. 20, 2019, now Pat. No. 11,081,518, which is a
(Continued)

(30) Foreign Application Priority Data

Apr. 7, 2017 (CN) .......................... 201710224073.2
Apr. 7, 2017 (CN) .......................... 201720365419.6
(Continued)

(51) Int. Cl.
*H01L 27/146* (2006.01)
*H01L 21/02* (2006.01)
(Continued)

(52) U.S. Cl.
CPC ........ *H01L 27/14683* (2013.01); *H01L 21/02* (2013.01); *H01L 23/06* (2013.01); *H01L 27/14618* (2013.01); *H04N 23/57* (2023.01)

(58) Field of Classification Search
CPC ... H01L 27/14683; H01L 21/02; H01L 23/06; H01L 27/14618; H04N 23/57
(Continued)

(56) References Cited

U.S. PATENT DOCUMENTS

2006/0071305 A1  4/2006  Ho et al.
2014/0008775 A1  1/2014  Usami et al.
(Continued)

FOREIGN PATENT DOCUMENTS

CN  101399238 A  4/2009
JP  H09321182 A  12/1997
(Continued)

OTHER PUBLICATIONS

Japanese Patent Office, Notice of Allowance for corresponding Japanese Patent Application JP2019-554764, dated Feb. 15, 2022, citing 12 references; 8 of 12 references are presented in this IDS, and 4 of 12 references have been in previous IDS; specifically: (A) JPH09321182A, JP2014013836A, and JP2016100573A in IDS filed on Jun. 21, 2021; and (B) JP2010050452A in IDS filed on Jan. 19, 2022. No English translation for JP Notice of Allowance.
(Continued)

*Primary Examiner* — Jami Valentine Miller
(74) *Attorney, Agent, or Firm* — Harvest IP Law LLP

(57) ABSTRACT

The present invention provides a semiconductor packaging method and semiconductor device based on a molding process. In the packaging method, first, at least a portion of a compensation part is kept on at least a portion of a bonding region formed between a first adjoining surface of a semiconductor element and a second adjoining surface of a
(Continued)

packaging component, to form a semi-finished product of a semiconductor device; then, during hardening of the packaging component, the compensation part is caused to undergo different degrees of deformation at different positions to compensate for a difference between a magnitude of deformation of the packaging component and a magnitude of deformation of the semiconductor element, so as to package the semiconductor element to form the semiconductor device. By means of the method, undesirable phenomena such as cracking and deformation of the surface of the semiconductor element can be avoided.

22 Claims, 11 Drawing Sheets

Related U.S. Application Data continuation of application No. 15/947,181, filed on Apr. 6, 2018, now Pat. No. 10,461,116.

(30) Foreign Application Priority Data

Aug. 17, 2017 (CN) .......................... 201710709097.7
Aug. 17, 2017 (CN) .......................... 201721042055.4

(51) Int. Cl.
*H01L 23/06* (2006.01)
*H04N 23/57* (2023.01)

(58) Field of Classification Search
USPC ........................................................ 257/433
See application file for complete search history.

(56) References Cited

U.S. PATENT DOCUMENTS

| 2015/0054112 | A1 | 2/2015 | Iwama et al. |
| 2016/0163884 | A1 | 6/2016 | Sorrieul et al. |
| 2017/0264802 | A1* | 9/2017 | Wang .................... H04N 23/54 |
| 2018/0288296 | A1* | 10/2018 | Wang .................. G02B 13/004 |

FOREIGN PATENT DOCUMENTS

| JP | 2006032617 A | 2/2006 |
| JP | 2006054209 A | 2/2006 |
| JP | 2009081346 A | 4/2009 |
| JP | 2010050452 A | 3/2010 |
| JP | 2012216678 A | 11/2012 |
| JP | 2014013836 A | 1/2014 |
| JP | 2016025183 A | 2/2016 |
| JP | 2016100573 A | 5/2016 |
| KR | 20120112070 A | 10/2012 |
| TW | 201236117 A1 | 9/2012 |

OTHER PUBLICATIONS

Korean Patent Office, Notice of Allowance for corresponding Korean Patent Application 10-2019-7032766, dated Dec. 16, 2021; citing references (1) KR20120112070 A, (2) US20160163884 A1, and (3) JP2010050452 A, which are all presented above. No English translation.

* cited by examiner

SEMICONDUCTOR PACKAGING METHOD AND SEMICONDUCTOR DEVICE BASED ON MOLDING PROCESS

CROSS-REFERENCE TO RELATED APPLICATIONS

This is a continuation of U.S. patent application Ser. No. 16/578,014, filed on Sep. 20, 2019, which is a continuation of U.S. patent application Ser. No. 15/947,181, filed on Apr. 6, 2018, now U.S. Pat. No. 10,461,116, issued on Oct. 29, 2019, which claims priority to Chinese Patent Application No. 201710224073.2, filed on Apr. 7, 2017, Chinese Patent Application No. 201720365419.6, filed on Apr. 7, 2017, Chinese Patent Application No. 201710709097.7, filed on Aug. 17, 2017 and Chinese Patent Application No. 201721042055.4, filed on Aug. 17, 2017. The afore-mentioned patent applications are hereby incorporated by reference in their entireties.

TECHNICAL FIELD

The present invention relates to the field of semiconductor packaging, and more particularly to a semiconductor packaging method and a semiconductor device based on a molding process, a camera apparatus and an image processing assembly thereof, and an electronic device including the camera apparatus.

BACKGROUND

The molding and packaging technique is well known in the semiconductor field. As shown in FIG. 1, the molding and packaging technique enables forming a packaging component 30P on at least a partial surface of a semiconductor element 10P and at least a partial surface of a encapsulated component 20P, so as to integrally bond the semiconductor element 10P to the encapsulated component 20P by means of the packaging component 30P. In addition, the molding and packaging technique also enables forming the packaging component 30P on at least a partial surface of the semiconductor element 10P, the packaging component 30P can embed at least the partial surface of the semiconductor element 10P, so as to protect the semiconductor element 10P, as shown in FIG. 2.

Taking the instance shown in FIG. 2 as an example, a concrete process of packaging the semiconductor element 10P by using the molding and packaging technique is as follows. As shown in FIG. 3, the semiconductor element 10P is first placed in a forming mold 40P in such a manner that a to-be-packaged surface of the semiconductor element 10P is exposed to a forming space 41P of the forming mold 40P. Next, as shown in FIG. 4, a forming material 50P in fluid form is introduced into the forming space 41P of the forming mold 40P, so that the forming material 50P fills up the forming space 41P of the forming mold 40P, and thus embeds the surface of the semiconductor element 10P that is exposed to the forming space 41P of the forming mold 40P. As shown in FIG. 5, after curing of the forming material 50P in the forming space 41P of the forming mold 40P and removal of the forming mold 40P, the forming material 50P can form the packaging component 30P encapsulated to at least a part of the surface of the semiconductor element 10P, where a first adjoining surface 31P of the packaging component 30P and a second adjoining surface 11P of the semiconductor element 10P correspond to each other.

To ensure that the semiconductor element 10P and the packaging component 30P can be encapsulated together more firmly and prevent the packaging component 30P from falling off from the semiconductor element 10P, a baking process needs to be carried out for the semiconductor element 10P encapsulated with the packaging component 30P after demolding, to achieve more reliable encapsulated between the packaging component 30P and the semiconductor element 10P. However, because the semiconductor element 10P and the packaging component 30P are made of different materials, the semiconductor element 10P and the packaging component 30P have different thermal expansion coefficients. In addition, because the polymerization and shrinkage of the material of the packaging component 30P continue during the baking, the semiconductor element 10P and the packaging component 30P undergo different degrees of deformation due to heat in the baking process. Specifically, referring to FIG. 5, the packaging component 30P is formed by curing of the forming material 50P introduced into the forming space 41P of the forming mold 40P. The packaging component 30P contracts inwardly fairly extensively when being heated in the baking process, and will further contract during cooling after baking. As a result, the first adjoining surface 31P of the packaging component 30P experiences a fairly extensive deformation. Theoretically, the second adjoining surface 11P of the semiconductor element 10P experiences a deformation to a smaller extent during cooling of the semiconductor element 10P after being heated, because the semiconductor element 10P has a smaller thermal expansion coefficient.

Because the first adjoining surface 31P of the packaging component 30P is integrally encapsulated to the second adjoining surface 11P of the semiconductor element 10P, the first adjoining surface 31P of the packaging component 30P, when experiencing a fairly extensive deformation, generates a pull force acting on the second adjoining surface 11P of the semiconductor element 10P. Due to the pull force, the extent of the deformation of the second adjoining surface 11P of the semiconductor element 10P is greater than a theoretical extent of the deformation of the second adjoining surface 11P of the semiconductor element 10P. In FIG. 5, a solid line 100P represents an actual extent of deformation of the semiconductor element 10P due to the contraction and deformation of the packaging component 30P, and a dashed line 200P represents a theoretical extent of deformation of the semiconductor element 10P. As a result of this, undesirable phenomena such as cracking, deformation, and fatigue occur on at least a part of the surface of the semiconductor element 10P. Once undesirable phenomena such as cracking, deformation, and fatigue occur on the surface of the semiconductor element 10P, electrical and other properties of the semiconductor element 10P will be greatly affected. It should be understood that, the adjoining surfaces of the packaging component 30P and the packaged component 20P are also encapsulated together, and therefore, the adjoining surface of the packaging component 30P, when experiencing a fairly extensive deformation, also generates a pull force acting on the adjoining surface of the packaged component 20P. As a result, the extent of the deformation of the adjoining surface of the packaged component 20P is greater than a theoretical extent of deformation of the packaged component 20P.

Undesirable phenomena such as cracking and deformation of the surface of the semiconductor element 10P caused by the fairly extensive contraction and deformation of the packaging component 30P in the baking process will greatly affect the product yield of the semiconductor element 10P.

Especially for the semiconductor element 10P used for photosensitive, it is requisite that the surface of the semiconductor element 10P be intact and as flat as possible. However, phenomena such as cracking and deformation of the surface of the semiconductor element 10P caused by the contraction and deformation of the packaging component 30P in the baking process greatly affects the product yield of the semiconductor element 10P, and even may directly lead to rejection of the semiconductor element 10P. Consequently, the molding and packaging technique cannot be applied to the packaging of the semiconductor element 10P used for photosensitive.

SUMMARY

The semiconductor packaging method and semiconductor device according to the present invention resolve at least some problems in the prior art.

An objective of the present invention is to provide a semiconductor packaging method and semiconductor device based on a molding process, where by means of the packaging method, a packaging component can be reliably and integrally encapsulated to at least a portion of a semiconductor element, and good electrical properties of the semiconductor element can be ensured by reducing the deformation of the semiconductor element.

An objective of the present invention is to provide a semiconductor packaging method and semiconductor device based on a molding process, where the packaging method is particularly suitable for reliably and integrally bonding the packaging component to a portion of the semiconductor element used for photosensitive (or referred to as a photosensitive element). The packaging method of the present invention can ensure the optical properties of the semiconductor element by reducing the deformation of the semiconductor element and avoiding cracking of the surface of the semiconductor element.

An objective of the present invention is to provide a semiconductor packaging method and semiconductor device based on a molding process, where in the packaging method, a compensation part is provided between the packaging component and the semiconductor element, so that in the baking process, the compensation part compensates for a difference between an extent of deformation of the packaging component and an extent of deformation of the semiconductor element, to prevent a pull force generated by contraction of the packaging component from acting on the semiconductor element, and therefore avoid cracking of the surface of the semiconductor element, thereby ensuring the intactness of the surface of the semiconductor element.

An objective of the present invention is to provide a semiconductor packaging method and semiconductor device based on a molding process, where the compensation part is elastic, so that when the semiconductor device is in use, the compensation part can compensate for the undesirable phenomenon that the upper surface of the packaging component and the non-adjoining surface of the semiconductor element are not parallel to each other due to that the semiconductor device is subject to vibrations.

An objective of the present invention is to provide a semiconductor packaging method and semiconductor device based on a molding process, where the compensation part is located on at least a portion of the non-adjoining surface of the semiconductor element, so that in the molding process, the compensation part can be located between the pressure applying surface of the forming mold and the semiconductor element, and absorb the impact force generated when the upper mold and the lower mold of the forming mold are closed, thereby preventing the impact force from acting on the semiconductor element.

An objective of the present invention is to provide a semiconductor packaging method and semiconductor device based on a molding process, where the compensation part can prevent the pressure applying surface of the forming mold from coming into contact with the non-adjoining surface of the semiconductor element, to prevent the pressure applying surface of the forming mold from scratching the non-adjoining surface of the semiconductor element, thereby ensuring the intactness of the non-adjoining surface of the semiconductor element.

An objective of the present invention is to provide a semiconductor packaging method and semiconductor device based on a molding process, where the compensation part can deform to prevent the formation of gaps between the pressure applying surface of the forming mold and the non-adjoining surface of the semiconductor element, so as to prevent the forming material used for forming the packaging component from flowing from the adjoining surface to the non-adjoining surface of the semiconductor element, thereby avoiding the undesirable flashing phenomenon.

An objective of the present invention is to provide a semiconductor packaging method and semiconductor device based on a molding process, where the compensation part is in the shape of a frame and has a through hole, and when the compensation part is disposed on the adjoining surface of the semiconductor element, the through hole of the compensation part corresponds to at least a portion of the non-adjoining surface of the semiconductor element.

An objective of the present invention is to provide a semiconductor packaging method and semiconductor device based on a molding process, where in the packaging method, the compensation part is provided between the packaging component and the encapsulated component, so that in the baking process, the compensation part compensates for a difference between an extent of deformation of the packaging component and an extent of deformation of the encapsulated component, to prevent a pull force generated by contraction of the packaging component from acting on the encapsulated component.

An objective of the present invention is to provide a semiconductor packaging method and semiconductor device based on a molding process, where the compensation part kept between the packaging component and the encapsulated component and the compensation part kept between the packaging component and the semiconductor element form a split-type structure, that is, the compensation part kept between the packaging component and the encapsulated component and the compensation part kept between the packaging component and the semiconductor element are independent of each other, so that the compensation parts respectively compensate for the difference between the extent of deformation of the packaging component and the extent of deformation of the encapsulated component and the difference between the extent of deformation of the packaging component and the extent of deformation of the semiconductor element.

An objective of the present invention is to provide a semiconductor packaging method and semiconductor device based on a molding process, where the compensation part has a multi-layer structure.

An objective of the present invention is to provide a semiconductor packaging method and semiconductor device based on a molding process, where in the packaging method, the packaging component is formed with an opening corresponding to the through hole of the compensation part and corresponding to at least a portion of the non-adjoining surface of the semiconductor element.

An objective of the present invention is to provide a semiconductor packaging method and semiconductor device based on a molding process, where in the packaging method, the semiconductor element is integrally and reliably encapsulated to a encapsulated component by forming the packaging component.

An objective of the present invention is to provide a semiconductor packaging method and semiconductor device based on a molding process, where in the packaging method, the compensation part is formed by applying a molding material to at least a portion of the adjoining surface of the semiconductor element.

According to an aspect of the present invention, the present invention provides a semiconductor packaging method based on a molding process, the packaging method comprising the following steps:

(a) keeping at least a portion of a compensation part on at least a portion of a bonding region formed between a first adjoining surface of a semiconductor element and a second adjoining surface of a packaging component, to form a semi-finished product of a semiconductor device; and (b) causing the compensation part to undergo different degrees of deformation at different positions to compensate for a difference between an extent of deformation of the packaging component and an extent of deformation of the semiconductor element during hardening of the packaging component, so as to package the semiconductor element to form the semiconductor device.

According to an embodiment of the present invention, in the step (a), semi-finished products of a plurality of semiconductor devices are connected to each other by the packaging component, and after the step (b), the packaging method further comprises the following step: (c) separating the semi-finished products of the plurality of semiconductor devices that are connected to each other.

According to an embodiment of the present invention, in the step (a), semi-finished products of a plurality of semiconductor devices are connected to each other by the packaging component, and before the step (b), the packaging method further comprises the following step: (c) separating the semi-finished products of the plurality of semiconductor devices that are connected to each other.

According to an embodiment of the present invention, before the step (a), the packaging method further comprises the following steps: (d) disposing the semiconductor element on a encapsulated component in an overlapping manner, so that in the step (a), the packaging component, the semiconductor element, and the encapsulated component are integrally encapsulated in such a manner that at least a portion of the semiconductor element and at least a portion of the encapsulated component are embedded in the packaging component.

According to an embodiment of the present invention, the step (a) further comprises the following steps:

providing a jointed board unit, wherein the jointed board unit has at least one semiconductor element;

disposing the compensation part on the semiconductor element in such a manner that at least a portion of the compensation part is located on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

According to an embodiment of the present invention, the step (a) further comprises the following steps:

providing a jointed board unit, wherein the jointed board unit has at least one semiconductor element;

forming at least a portion of the compensation part on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

According to an embodiment of the present invention, in the above-mentioned method, after the compensation part is disposed on a top surface of the semiconductor element, at least a portion of a side surface of the semiconductor element is automatically embedded in an outer embedding portion of the compensation part.

According to an embodiment of the present invention, in the above-mentioned method, after the compensation part is disposed on a top surface of the semiconductor element, the molding process is performed by using the forming mold so that an outer embedding portion of the compensation part is pressed to enter into close contact with at least a portion of a side surface of the semiconductor element.

According to an embodiment of the present invention, in the above-mentioned method, after the compensation part is disposed on a top surface of the semiconductor element, at least a portion of an exposed region of the encapsulated component is automatically embedded in an outer embedding portion of the compensation part.

According to an embodiment of the present invention, in the above-mentioned method, after the compensation part is disposed on a top surface of the semiconductor element, the molding process is performed by using the forming mold so that an outer embedding portion of the compensation part is pressed to embed at least a portion of an exposed region of the encapsulated component.

According to an embodiment of the present invention, in the above-mentioned method, a portion of the compensation part is formed on an exposed region of the encapsulated component.

According to an embodiment of the present invention, in the above-mentioned method, the entire exposed region of the encapsulated component is embedded in the outer embedding portion of the compensation part.

According to an embodiment of the present invention, in the above-mentioned method, a film layer is provided between a pressure applying surface of the forming mold and a non-adjoining surface of the semiconductor element, so that the pressure applying surface of the forming mold and the non-adjoining surface of the semiconductor element are isolated by the film layer.

According to an embodiment of the present invention, in the above-mentioned method, a portion of the compensation part is extended from the first adjoining surface of the semiconductor element to at least a portion of a non-adjoining surface of the semiconductor element, so that a pressure applying surface of the forming mold and the non-adjoining surface of the semiconductor element are isolated by the portion of the compensation part in the molding process.

According to an embodiment of the present invention, in the above-mentioned method, a molding material is applied to at least a portion of the first adjoining surface of the semiconductor element, so as to form the compensation part after the molding material cures.

According to an embodiment of the present invention, in the above-mentioned method, a molding material is applied to at least a portion of the first adjoining surface and at least a portion of a non-adjoining surface of the semiconductor element, so as to form the compensation part after the molding material cures.

According to an embodiment of the present invention, in the above-mentioned method, a molding material is applied to at least a portion of the first adjoining surface of the semiconductor element and at least a portion of the exposed region of the encapsulated component, so as to form the compensation part after the molding material cures.

According to an embodiment of the present invention, in the above-mentioned method, the molding material is applied to at least a portion of a non-adjoining surface of the semiconductor element.

According to an embodiment of the present invention, the molding material is ink, glue, or solution containing a solvent.

According to an embodiment of the present invention, in the above-mentioned method, a plurality of semiconductor elements is arranged on a substrate in a predetermined manner to form a jointed board unit.

According to an embodiment of the present invention, in the above-mentioned method, the semi-finished products of the plurality of semiconductor devices are separated from top to bottom to form the semiconductor devices.

According to an embodiment of the present invention, in the above-mentioned method, the semi-finished products of the plurality of semiconductor devices are separated from bottom to top to form the semiconductor devices.

According to an embodiment of the present invention, the compensation part is provided or formed between the packaging component and the encapsulated component.

According to an embodiment of the present invention, the compensation part kept between the packaging component and the encapsulated component and the compensation part kept between the packaging component and the semiconductor element form an integral structure.

According to an embodiment of the present invention, the compensation part kept between the packaging component and the encapsulated component and the compensation part kept between the packaging component and the semiconductor element are independent of each other.

According to an embodiment of the present invention, the compensation part has a multi-layer structure.

According to another aspect of the present invention, the present invention further provides a semiconductor device based on a molding process, comprising:

a compensation part;

a semiconductor element, wherein the semiconductor element has a first adjoining surface; and a packaging component, having a second adjoining surface, wherein the packaging component is integrally encapsulated to the semiconductor element at a position corresponding to the first adjoining surface of the semiconductor element by using a molding process, so that at least a portion of the compensation part is kept on at least a portion of a bonding region formed between the first adjoining surface of the semiconductor element and the second adjoining surface of the packaging component.

According to an embodiment of the present invention, the semiconductor element further has a non-adjoining surface, and the compensation part extends from the first adjoining surface of the semiconductor element to at least a portion of the non-adjoining surface.

According to an embodiment of the present invention, the compensation part has a through hole, the packaging component has an opening, the through hole of the compensation part corresponds to a portion of the non-bonding region of the semiconductor element, and the opening of the packaging component corresponds to a portion of the non-adjoining surface of the semiconductor element.

According to an embodiment of the present invention, the packaging component has an opening, and the opening corresponds to at least a portion of the non-bonding region of the semiconductor element.

According to an embodiment of the present invention, the compensation part is elastic.

According to an embodiment of the present invention, the compensation part is formed by resin curing, formed by ink coating, formed by coating a solution containing a solvent followed by curing after the solvent is dried off, or formed by metal electroplating or chemical plating.

According to an embodiment of the present invention, the semiconductor device further comprises a encapsulated component, wherein an exposed region of the encapsulated component is embedded in the packaging component.

According to an embodiment of the present invention, the compensation part extends from the first adjoining surface of the semiconductor element to at least a portion of the exposed region of the encapsulated component.

According to an embodiment of the present invention, the entire exposed region of the encapsulated component is embedded in the outer embedding portion of the compensation part.

According to an embodiment of the present invention, the compensation part is provided or formed between the encapsulated component and the packaging component.

According to an embodiment of the present invention, the compensation part kept between the packaging component and the encapsulated component and the compensation part kept between the packaging component and the semiconductor element form an integral structure.

According to an embodiment of the present invention, the compensation part kept between the packaging component and the encapsulated component and the compensation part kept between the packaging component and the semiconductor element are independent of each other.

According to an embodiment of the present invention, the compensation part has a multi-layer structure.

An objective of the present invention is to provide an image processing assembly, comprises: a encapsulated component; a photosensitive element, supported by at least one portion of a top surface of the encapsulated component; a compensation part, disposed in a portion of the top surface of the encapsulated component other than the at least one portion, and in contact with aside portion of the photosensitive element; and a packaging component, configured to embed at least two of the photosensitive element, the encapsulated component, and the compensation part.

According to an implementation of the present invention, the compensation part is distributed around the photosensitive element to form a frame.

According to an implementation of the present invention, the packaging component embeds the photosensitive element, the encapsulated component, and the compensation part, and is in contact with the photosensitive element, the encapsulated component, and the compensation part.

According to an implementation of the present invention, the packaging component has an opening, and the opening corresponds to a portion of the photosensitive element.

According to an implementation of the present invention, the packaging component is formed by curing of a fluid medium on at least two of the photosensitive element, the encapsulated component, and the compensation part.

According to an implementation of the present invention, the compensation part is located on a portion of the portion of the top surface of the encapsulated component other than the at least one portion.

According to an implementation of the present invention, the compensation part is located on the entire second portion of the top surface of the encapsulated component other than the at least one portion.

According to an implementation of the present invention, the compensation part fills up a space that is jointly formed by the portion of the top surface of the encapsulated component other than the at least one portion, a side surface of the photosensitive element, and the packaging component.

According to an implementation of the present invention, the compensation part has a height less than that of the photosensitive element.

According to an implementation of the present invention, the compensation part is formed by resin curing.

According to an implementation of the present invention, the compensation part is formed by ink coating.

According to an implementation of the present invention, the compensation part is formed by coating a solution containing a solvent followed by curing after the solvent is dried off.

According to an implementation of the present invention, the compensation part is formed by metal electroplating or chemical plating.

According to an implementation of the present invention, the compensation part has a multi-layer structure.

An objective of the present invention is to provide a camera apparatus, comprises: an optical lens assembly; a encapsulated component; a photosensitive element, supported by at least one portion of a top surface of the encapsulated component; a compensation part, disposed in a portion of the top surface of the encapsulated component other than the at least one portion, and in contact with a side portion of the photosensitive element; a packaging component, configured to embed at least two of the photosensitive element, the encapsulated component, and the compensation part; a driver, wherein the optical lens assembly is drivably disposed on the driver, and the driver is mounted on a top surface of the packaging component, so that the optical lens assembly is kept on a light path of the photosensitive element; a filter element, wherein the filter element is mounted on the top surface of the packaging component, so that the filter element is kept between the optical lens assembly and the photosensitive element; and a circuit board, wherein a chip connecting part of the photosensitive element is conductively connected to a circuit board connecting part of the circuit board.

An objective of the present invention is to provide a the electronic device, comprises: a device body; a camera apparatus, wherein the camera apparatus is disposed on the device body, and the camera apparatus further comprises: an optical lens assembly; a encapsulated component; a photosensitive element, supported by at least one portion of a top surface of the encapsulated component; a compensation part, disposed in a portion of the top surface of the encapsulated component other than the at least one portion, and in contact with a side portion of the photosensitive element; and a packaging component, configured to embed at least two of the photosensitive element, the encapsulated component, and the compensation part.

An objective of the present invention is to provide a photosensitive element packaging method based on a molding process, comprising: supporting photosensitive elements on at least one portion of a top surface of a encapsulated component; disposing a compensation part on a part, which is close to the at least one portion, of the top surface of the encapsulated component so that the compensation part is in contact with side portions of the photosensitive elements; and embedding at least two of the photosensitive elements, the encapsulated component, and the compensation part by using a packaging component.

According to an implementation of the present invention, the step of disposing a compensation part on the part, which is close to the at least one portion, of the top surface of the encapsulated component so that the compensation part is in contact with side portions of the photosensitive elements comprises: disposing the compensation part around the photosensitive elements to form a frame-shaped compensation part.

According to an implementation of the present invention, the step of embedding at least two of the photosensitive elements, the encapsulated component, and the compensation part by using a packaging component comprises: embedding the photosensitive elements, the encapsulated component, and the compensation part by using the packaging component, so that the packaging component is in contact with the photosensitive elements, the encapsulated component, and the compensation part.

According to an implementation of the present invention, the packaging component has an opening, and the opening corresponds to a portion of the photosensitive element.

According to an implementation of the present invention, the photosensitive elements embedded in the packaging component are in a multi-die form, and the method further comprises: separating the photosensitive elements embedded in the packaging component.

According to an implementation of the present invention, the step of embedding at least two of the photosensitive elements, the encapsulated component, and the compensation part by using the packaging component comprises: embedding at least two of the photosensitive elements, the encapsulated component, and the compensation part by using a fluid medium, and allowing the fluid medium to cure.

According to an implementation of the present invention, the compensation part is formed by curing of a fluid medium applied to the side portions of the photosensitive elements.

According to an implementation of the present invention, the step of disposing a compensation part on the part, which is close to the at least one portion, of the top surface of the encapsulated component comprises:

disposing the compensation part on a portion of the portion of the top surface of the encapsulated component.

According to an implementation of the present invention, the compensation part has a height less than that of the photosensitive element.

According to an implementation of the present invention, the compensation part has a multi-layer structure.

DETAILED DESCRIPTION OF EMBODIMENTS

Figure 1:
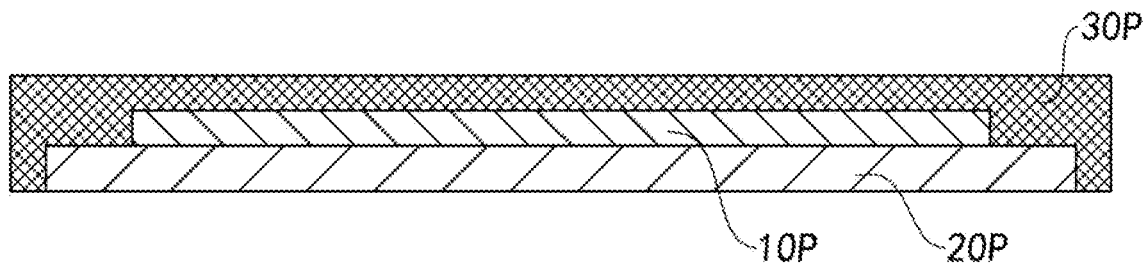
FIG. 1 is a schematic cross-sectional view of a molded semiconductor assembly formed by forming a packaging component to bond a semiconductor element to a encapsulated component according to an existing molding and packaging technique.
Figure 2:
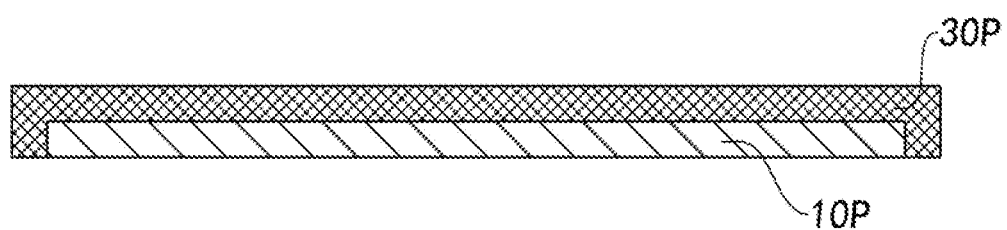
FIG. 2 is a schematic cross-sectional view of a molded semiconductor assembly formed by forming a packaging component to embed a surface of a semiconductor element according to an existing molding and packaging technique.
Figure 3:
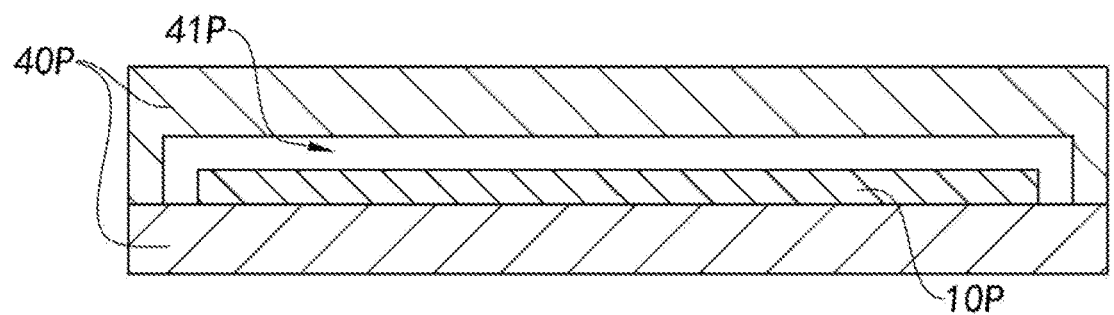
FIG. 3 and FIG. 4 are respectively schematic cross-sectional views illustrating a process of forming a semi-finished product of a molded semiconductor assembly according to an existing molding and packaging technique.
Figure 4:
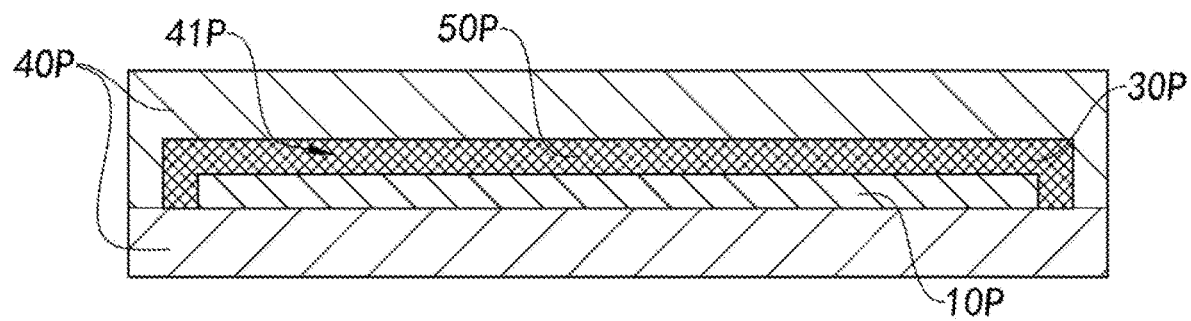
Figure 5:
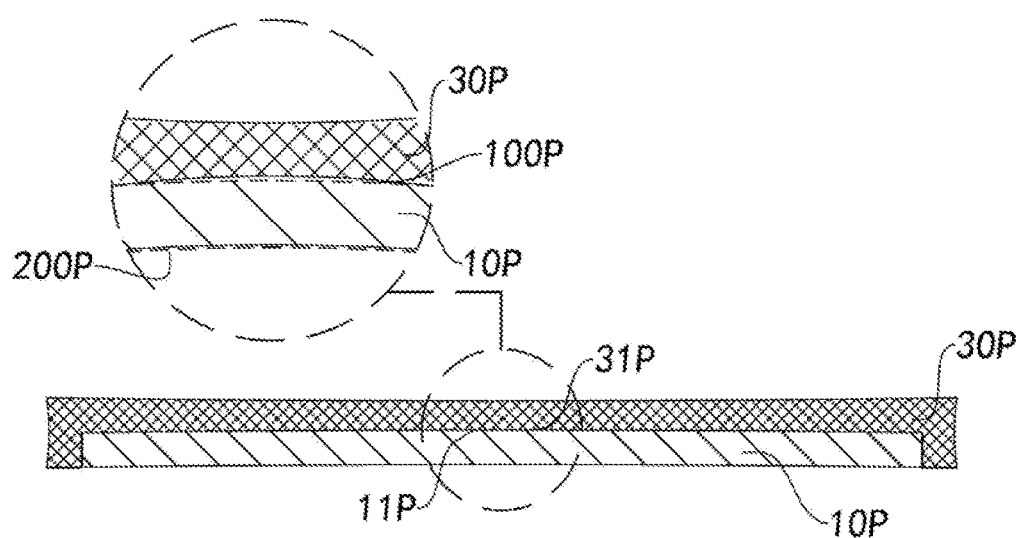
FIG. 5 is a schematic cross-sectional view illustrating deformation of the packaging component and the semiconductor element that form the molded semiconductor assembly due to different thermal expansion coefficients during baking of the semi-finished product of the molded semiconductor assembly.

The following descriptions are used for disclosing the present invention so as to enable those skilled in the art to implement the present invention. Preferred embodiments in the following descriptions are provided by way of example only, and other apparent variants can be easily conceived of by those skilled in the art. The basic principles of the present invention that are defined in the following descriptions can be applied to other implementation solutions, variant solutions, improved solutions, equivalent solutions, and other technical solutions that do not depart from the spirit and scope of the present invention.

It should be understood by those skilled in the art that in the disclosure of the present invention, orientational or positional relationships indicated by the terms such as "longitudinal", "transverse", "up", "down", "front", "rear", "left", "right", "vertical", "horizontal", "top", "bottom", "inner", and "outer" are based on the orientational or positional relationships shown in the accompanying drawings, are provided merely for convenience and brevity of description, and do not indicate or imply that the apparatus or element involved must have a particular orientation or must be constructed and operate with a particular orientation. Therefore, such terms should not be construed as limiting the present invention.

It should be understood that the terms "a" and "an" should be construed as "at least one" or "one or more", that is, the number of elements may be one in an embodiment, and may be more than one in another embodiment. The terms "a" and "an" should not be construed as limiting the number.

In recent years, with the rapid development of electronic devices such as smart phones, tablet computers, notebook computers, personal computers, personal digital assistants and e-books and related technologies, not only continuous miniaturization of semiconductor elements is required, but also more strict requirements are imposed on the performance of semiconductor elements. Due to the defects of existing molding processes, a semiconductor element cannot provide desirable performance after being molded and packaged. Especially for some semiconductor elements that can provide special functions, for example, a semiconductor element used for photosensitive, the existing molding process causes undesirable phenomena such as severe deformation and cracking of the surface of the semiconductor element, resulting in that after being molded and packaged, the semiconductor element cannot meet the demand of electronic devices for high-performance semiconductor elements, as described in the Background section of the present invention and shown in FIG. 1 to FIG. 5.

In the following descriptions, the present invention sets forth a semiconductor packaging method based on a molding process, where the packaging method can effectively resolve the problems of the existing molding process and provide a semiconductor device having higher performance, so as to meet the requirements of electronic devices, which are developing toward high integration, intelligence, miniaturization, and light and thin structure, on the semiconductor device.

Figure 6A:
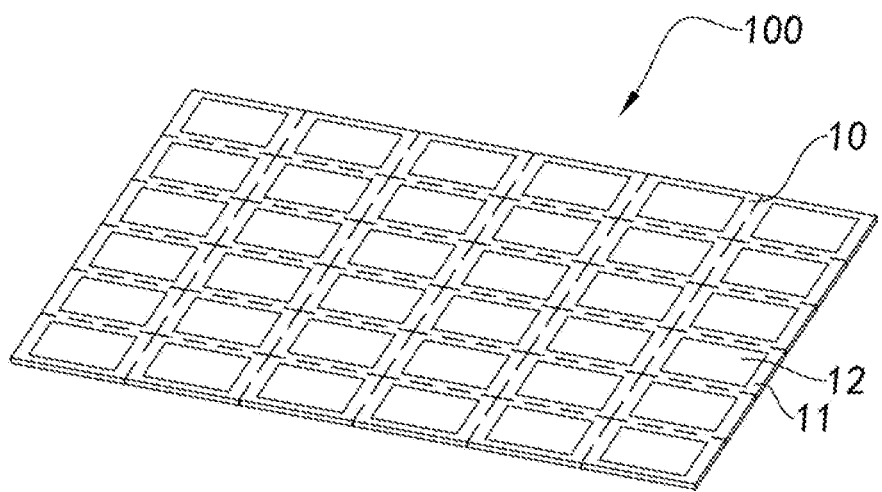
FIG. 6A is a three-dimensional schematic diagram of a first implementation of a jointed board unit according to a preferred embodiment of the present invention.

FIG. 6A illustrates an implementation of a jointed board unit 100, where semiconductor elements 10 are not separated after being prepared at the same time, so that neighboring semiconductor elements 10 are arranged together side by side to form the jointed board unit 100. In this way, in a subsequent molding process, all the semiconductor elements 10 used for forming the jointed board unit 100 can be molded at the same time. It should be noted that dashed lines in FIG. 6A represent positions at which the neighboring semiconductor elements 10 are connected, that is, the neighboring semiconductor elements 10 are separated along the positions shown by the dashed lines after the subsequent molding process is complete.

Figure 6B:
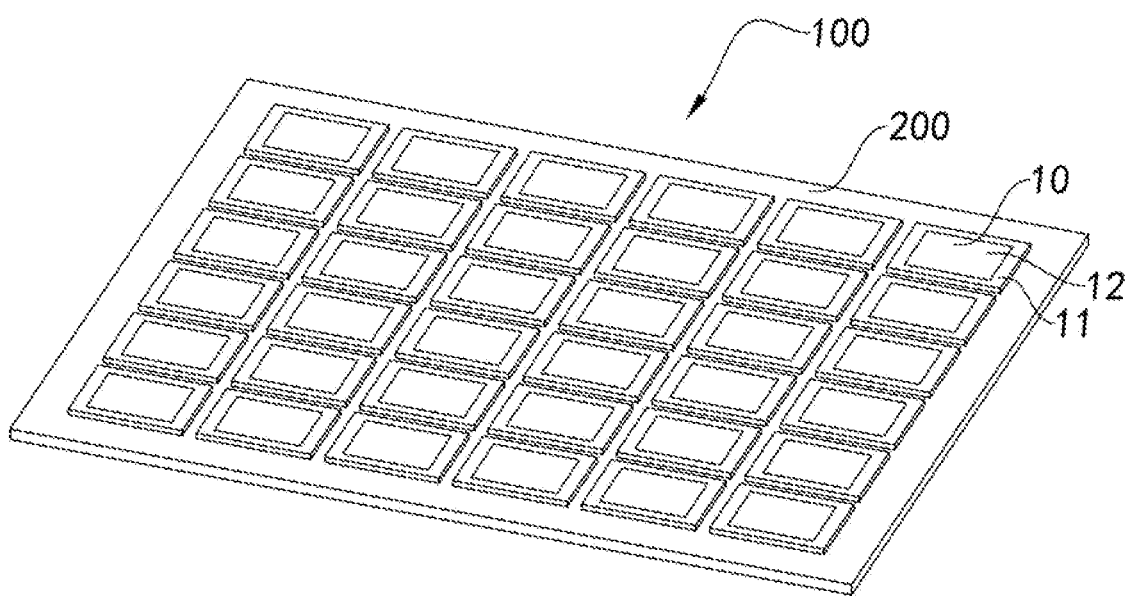
FIG. 6B is a three-dimensional schematic diagram of a second implementation of the jointed board unit according to the above-mentioned preferred embodiment of the present invention.

FIG. 6B illustrates another implementation of the jointed board unit 100, where semiconductor elements 10 are separated after being prepared at the same time, to form separate semiconductor elements 10, and then the semiconductor elements 10 are arranged on a surface of a substrate 200 in a predetermined manner to form the jointed board unit 100. For example, the semiconductor elements 10 may be arranged on the substrate 200 in rows or in columns.

Generally, the material of the substrate 200 is not limited, as long as the material can provide good flatness to ensure the flatness of the semiconductor elements 10 arranged on the substrate 200.

It should be understood by those skilled in the art that, the manner in which a plurality of semiconductor elements 10 formed at the same time are separated and then arranged on the surface of the substrate 200 to form the jointed board unit 100 allows the distance between the neighboring semiconductor elements 10 to be adjusted according to requirements. For example, generally (not in all cases), the distance between the neighboring semiconductor elements 10 of the jointed board unit 100 shown in FIG. 6B may be greater than that between the neighboring semiconductor elements 10 of the jointed board unit 100 shown in FIG. 6A. This manner facilitates the subsequent molding process.

Preferably, the neighboring semiconductor elements 10 arranged on the substrate 200 are spaced with a same distance. Optionally, only the neighboring semiconductor elements 10 in each column of semiconductor elements 10 are spaced with a same distance, or only the neighboring semiconductor elements 10 in each row of semiconductor elements 10 are spaced with a same distance.

It should be noted that, in other examples of the packaging method, only one semiconductor element 10 may be disposed on the substrate 200 to form the jointed board unit 100, so that in the subsequent molding process, only one semiconductor element 10 is molded each time. This is not limited in the packaging method of the present invention.

Figure 7A:
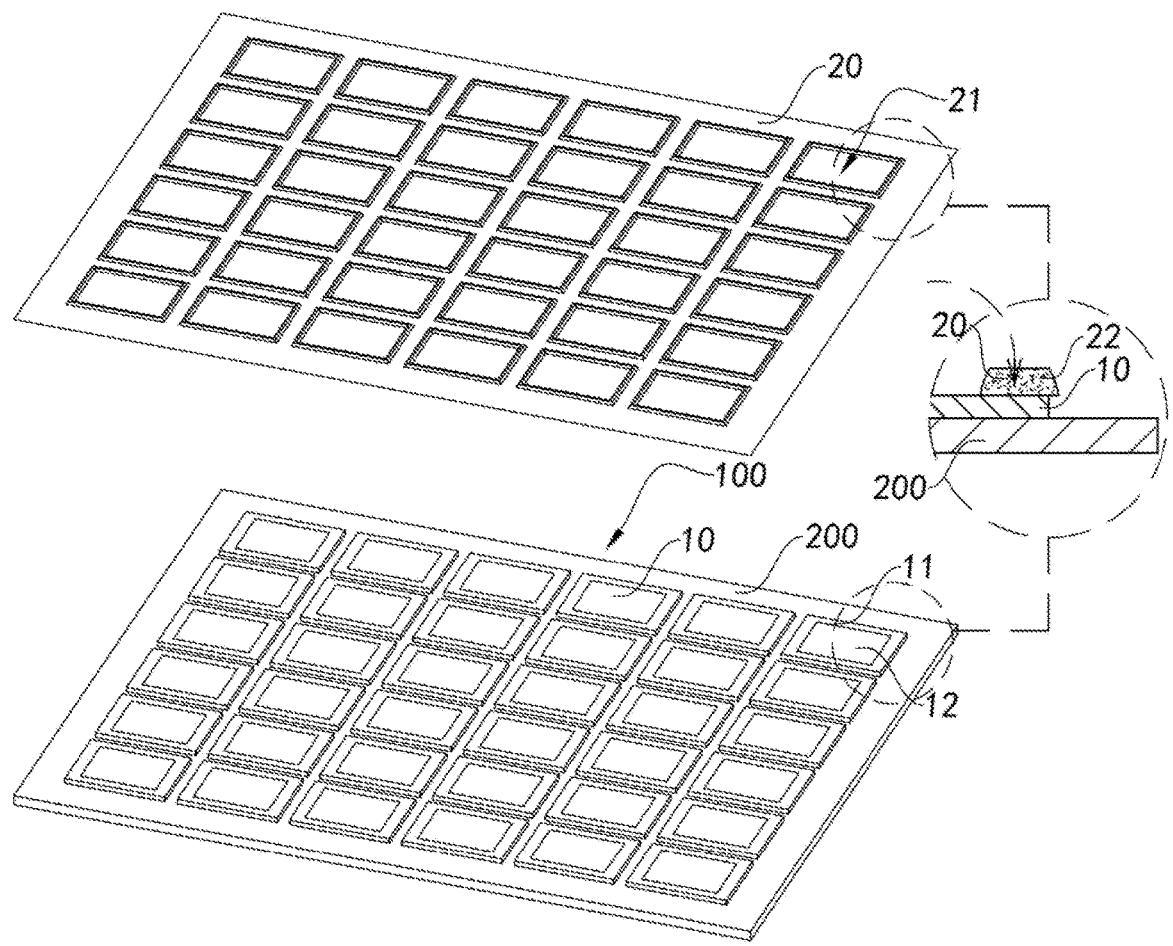
FIG. 7A and FIG. 7B are respectively schematic cross-sectional views of step 1 of a packaging method according to a preferred embodiment of the present invention, illustrating a state in which a compensation part is disposed on the jointed board unit so that the compensation part is disposed in an overlapping manner on at least a portion of a surface of a semiconductor element used for forming the jointed board unit.
Figure 7B:
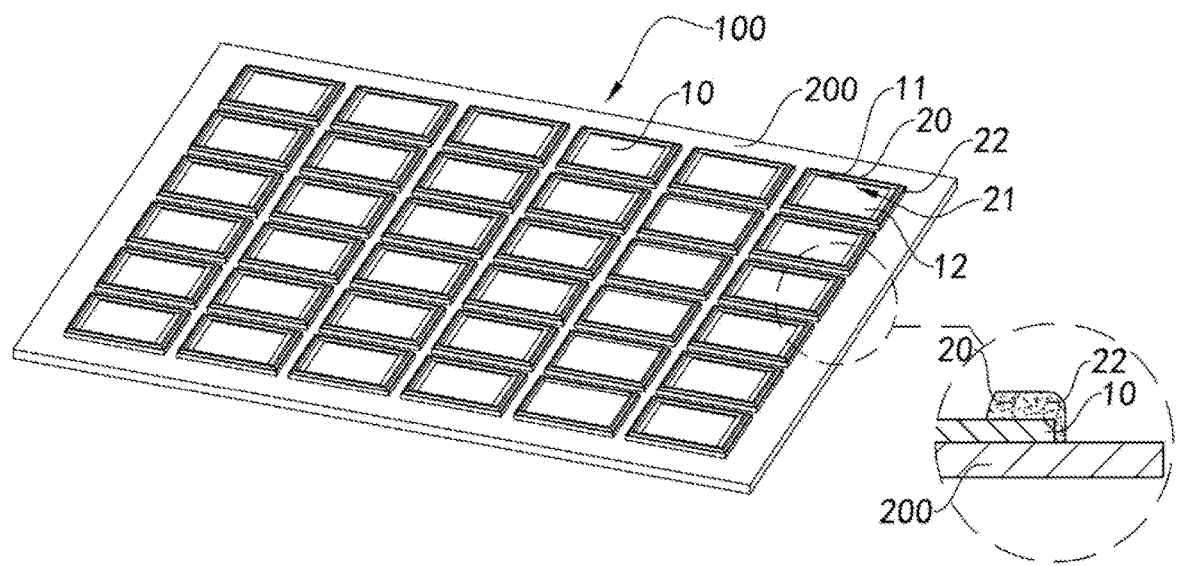

Referring to FIG. 7A and FIG. 7B, in an implementation of the packaging method, an elastic compensation part 20 may be placed on the jointed board unit 100, so that at least a portion of the compensation part 20 is disposed to overlap with at least a portion of a first adjoining surface 11 of each semiconductor element 10. Preferably, the compensation part 20 may also be overlapped with at least a portion of a non-adjoining surface 12 of each semiconductor element 10, that is, the compensation part 20 can extend from the first adjoining surface 11 of the semiconductor element 10 to at least a portion of the non-adjoining surface 12.

That is to say, in an example of the semiconductor device of the present invention, the semiconductor element 10 only has the first adjoining surface 11, and the compensation part 20 is disposed in an overlapping manner on at least a portion of the first adjoining surface 11 of the semiconductor element 10. In another example of the semiconductor device of the present invention, the semiconductor element 10 has the first adjoining surface 11 and the non-adjoining surface 12, and the compensation part 20 may be disposed in an overlapping manner on at least a portion of the first adjoining surface 11 of the semiconductor element 10, or may be disposed in an overlapping manner on both at least a portion of the first adjoining surface 11 and at least a portion of the non-adjoining surface 12.

Preferably, the compensation part 20 embeds all regions of the first adjoining surface 11 of the semiconductor element 10.

The first adjoining surface 11 of the semiconductor element 10 is located on at least a portion of an edge region of the semiconductor element 10, and the non-adjoining surface 12 of the semiconductor element 10 is located on a central region of the semiconductor element 10. Preferably, the first adjoining surface 11 of the semiconductor element 10 may be in the shape of a frame surrounding the outer side of the non-adjoining surface 12. In other examples, the first adjoining surface 11 of the semiconductor element 10 may be "C"-shaped, "L"-shaped, "I"-shaped, and so on.

In addition, the compensation part 20 may also have at least one through hole 21, where the through hole 21 of the compensation part 20 corresponds to at least a portion of the non-adjoining surface 12 of the semiconductor element 10. For example, when the compensation part 20 is disposed in an overlapping manner only on at least a portion of the first adjoining surface 11 of the semiconductor element 10, all regions of the non-adjoining surface 12 of the semiconductor element 10 may correspond to the through hole 21 of the compensation part 20; correspondingly, when the compensation part 20 is disposed in an overlapping manner on both at least a portion of the first adjoining surface 11 of the semiconductor element 10 and a portion of the non-adjoining surface 12, the other portion of the non-adjoining surface 12 of the semiconductor element 10 corresponds to the through hole 21 of the compensation part 20.

In addition, in one example, when the compensation part 20 is subject only to gravity, the compensation part 20 can keep its original shape, so that the compensation part 20 only embeds at least a portion of the first adjoining surface 11 of the semiconductor element 10, that is, the compensation part 20 is disposed to overlap with only at least a portion of the first adjoining surface 11 of the semiconductor element 10. For example, when the compensation part 20 has high hardness, the compensation part 20 does not deform when subject only to gravity. In addition, an outer side portion of the compensation part 20 may extend to the outside of the semiconductor element 10, to form an outer embedding portion 22. In the subsequent molding process, when the compensation part 20 is pressed, the outer embedding portion 22 of the compensation part 20 is not supported by the semiconductor element 10 and thus deforms due to the pressure, so that the outer embedding portion 22 of the compensation part 20 embeds or comes into close contact with the side surface of the semiconductor element 10.

In another example, when the compensation part 20 is subject only to gravity, the outer embedding portion 22 of the compensation part 20 is not supported by the semiconductor element 10 and therefore automatically deforms to embed the side surface of the semiconductor element 10. For example, when the compensation part 20 has low hardness, the outer embedding portion 22, which is not supported by the semiconductor element 10, of the compensation part 20 automatically deforms when subject only to gravity, to embed the side surface of the semiconductor element 10.

The compensation part 20 may be provided or may be prefabricated. For example, the compensation part 20 may be formed by curing of a material such as glue or resin. In some examples, the through hole 21 of the compensation part 20 is formed while the compensation part 20 is formed, that is, the compensation part 20 may be in the shape of a frame, so that the through hole 21 of the compensation part 20 that is overlapped with a portion of the top surface of the semiconductor element 10 can correspond to at least a portion of the non-adjoining surface 12 of the semiconductor element 10. However, it should be understood by those skilled in the art that, the through hole 21 may also be formed by stamping or other means after the compensation part 20 is fabricated. This is not limited in the packaging method of the present invention.

Figure 8:
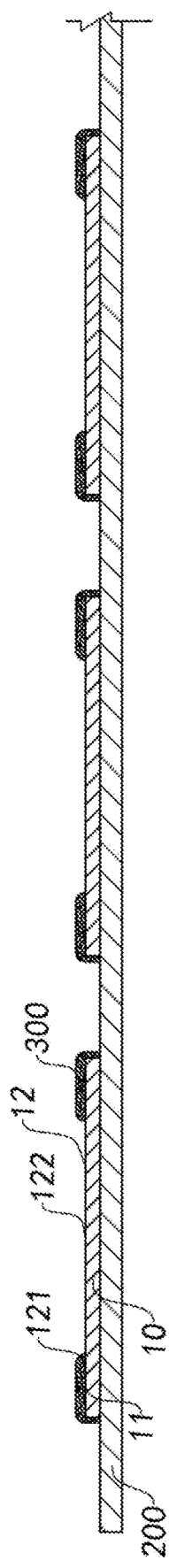
FIG. 8 is a schematic cross-sectional view of a variant implementation of step 1 of a packaging method according to a preferred embodiment of the present invention, illustrating a state in which a molding material is applied to the jointed board unit so that the molding material embeds at least a portion of a surface of a semiconductor element used for forming the jointed board unit.

Referring to FIG. 8, in other examples of the packaging method, a molding material 300 may further be applied to the jointed board unit 100, so that subsequently the molding material 300 can form the compensation part 20.

In one example, the molding material 300 may be applied to only at least a portion of the first adjoining surface 11 of the semiconductor element 10. Preferably, the molding material 300 is applied to all regions of the first adjoining surface 11 of the semiconductor element 10, including the portion of the top surface of the semiconductor element 10 that is used for forming the first adjoining surface 11, and the side surface of the semiconductor element 10.

In another example, the molding material 300 may be applied to all regions of the semiconductor element 10.

In other examples, the molding material 300 may be applied to at least a portion of the first adjoining surface 11 of the semiconductor element 10 and a portion of the non-adjoining surface 12. That is to say, a portion of the non-adjoining surface 12 of the semiconductor element 10 may not require application of the molding material 300, so that when subsequently the molding material 300 forms the compensation part 20, the part, to which the molding material 300 is not applied, of the non-adjoining surface 12 of the semiconductor element 10 forms the through hole 21 of the compensation part 20. Preferably, the molding material 300 is not applied to a central region of the non-adjoining surface 12 of the semiconductor element 10.

It should be noted that, the type of the molding material 300 applied to the semiconductor element 10 is not limited in the packaging method of the present invention. For example, the molding material 300 may be implemented as, but not limited to, ink, glue, solution containing a solvent, or the like, and therefore the manner in which the molding material 300 forms the compensation part 20 may be ink curing, glue curing, or curing of a solution containing a solvent after the solvent is dried off. In addition, the compensation part 20 may also be formed by metal electroplating or chemical plating.

Figure 9A:
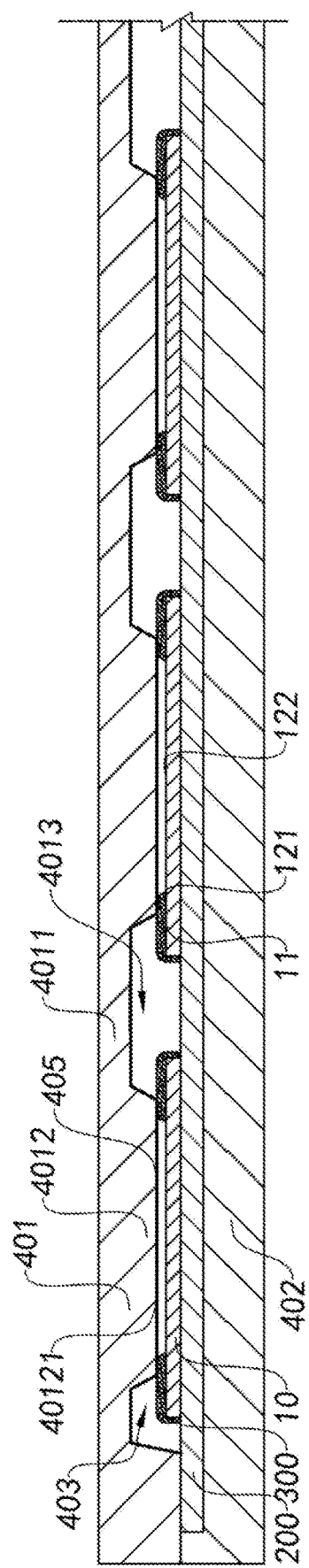
FIG. 9A and FIG. 9B are respectively schematic cross-sectional views of step 2 of the packaging method according to the above-mentioned preferred embodiment of the present invention, illustrating a state in which the jointed board unit is placed in a forming mold so that a first adjoining surface of each semiconductor element corresponds to a forming space of the forming mold.
Figure 9B:
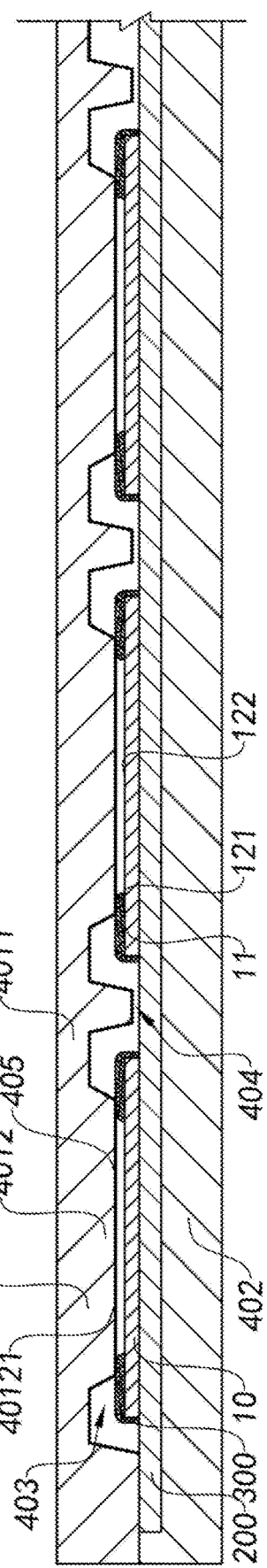

Referring to FIG. 9A and FIG. 9B, the jointed board unit 100 with the compensation part 20 is placed in a forming mold 400, so as to carry out a molding process by using the forming mold 400.

Specifically, the forming mold 400 includes an upper mold 401 and a lower mold 402, where any one of the upper mold 401 and the lower mold 402 is operable in such a manner that at least one forming space 403 is formed between the upper mold 401 and the lower mold 402 of the forming mold 400 during closing and drafting operations of the forming mold 400. When the forming mold 400 is closed, the first adjoining surface 11 of each semiconductor element 10 is located inside one forming space 403 when the jointed board unit 100 is placed between the upper mold 401 and the lower mold 402 of the forming mold 400.

When two or more forming spaces 403 are formed between the upper mold 401 and the lower mold 402, at least one communication channel 404 may further be formed between the upper mold 401 and the lower mold 402, to communicate neighboring forming spaces 403.

Further, the upper mold 401 includes a forming guiding portion 4011 and at least one opening forming portion 4012, where each opening forming portion 4012 integrally extend along the forming guiding portion 4011, so as to form a forming guiding groove 4013 between each opening forming portion 4012 and the forming guiding portion 4011, or form a forming guiding groove 4013 between neighboring opening forming portions 4012. When the upper mold 401 and the lower mold 402 are closed, one forming space 403 is formed at a position corresponding to each forming guiding groove 4013 and the communication channels 404 are formed between the upper mold 401 and the lower mold 402, to communicate the neighboring forming spaces 403.

When the upper mold 401 and the lower mold 402 of the forming mold 400 are closed and the jointed board unit 300 is kept between the upper mold 401 and the lower mold 402, a portion of the compensation part 20 is located between a pressure applying surface 40121 of the upper mold 401 and the non-adjoining surface 12 of the semiconductor element 10. In this way, the compensation part 20 can deform to absorb the impact force generated when the forming mold 400 is closed, so as to prevent the impact force from directly acting on the semiconductor element 10. In addition, the compensation part 20 can deform to prevent the formation of gaps between the pressure applying surface 40121 of the upper mold 401 and the non-adjoining surface 12 of the semiconductor element 10, thereby preventing the occurrence of the undesirable flashing phenomenon after the molding process. Furthermore, the compensation part 20 projects from the non-adjoining surface 12 of the semiconductor element 10, and therefore when the pressure applying surface 40121 of the upper mold 401 applies pressure toward the semiconductor element 10, the compensation part 20 not only can isolate the pressure applying surface 40121 of the upper mold 401 from the part, to which the molding material 300 is applied, of the non-adjoining surface 12 of the semiconductor element 10, but also can form gaps between the pressure applying surface 40121 of the upper mold 401 and the part, to which the molding material 300 is not applied, of the non-adjoining surface 12 of the semiconductor element 10, to prevent the pressure applying surface 40121 of the upper mold 401 from scratching the non-adjoining surface 12 of the semiconductor element 10.

Specifically, the part, to which the molding material 300 is applied, of the non-adjoining surface 12 of the semiconductor element 10 is defined as a pressure-receiving portion 121, and the part, to which the molding material 300 is not applied, of the non-adjoining surface 12 of the semiconductor element 10 is defined as an exposed portion 122; or the part, which is covered by the compensation part 20, of the non-adjoining surface 12 of the semiconductor element 10 is defined as the pressure-receiving portion 121, and the part, which is not covered by the compensation part 20, of the non-adjoining surface 12 of the semiconductor element 10 is defined as the exposed portion 122. When the jointed board unit 100 is placed between the upper mold 401 and the lower mold 402 that are closed, the compensation part 20 can isolate the pressure-receiving portion 121 of the semiconductor element 10 from the pressure applying surface 40121 of the upper mold 401, and can form gaps between the exposed portion 122 of the semiconductor element 10 and the pressure applying surface 40121 of the upper mold 401, to prevent the pressure applying surface 40121 of the upper mold 401 from scratching the non-adjoining surface 12 of the semiconductor element 10.

It should be noted that, generally, a pressing surface of the opening forming portion 4012 of the upper mold 401 forms the pressure applying surface 40121.

In addition, the forming mold 400 may further include a film layer 405, where the film layer 405 is disposed in an overlapping manner on the pressure applying surface 40121 of the upper mold 401. For example, the film layer 405 may be disposed in an overlapping manner on the pressure applying surface 40121 of the upper mold 401 by attaching the film layer 405 to the pressure applying surface 40121 of the upper mold 401. In this way, in the molding process, the film layer 405 can be located between the pressure applying surface 40121 of the upper mold 401 and the non-adjoining surface 12 of the semiconductor element 10, and isolate the pressure applying surface 40121 of the upper mold 401 from the non-adjoining surface 12 of the semiconductor element 10, to prevent the pressure applying surface 40121 of the upper mold 401 from scratching the non-adjoining surface 12 of the semiconductor element 10. In addition, the film layer 405 may also be elastic, so that when the upper mold 401 and the lower mold 402 of the forming mold 400 are closed, the film layer 405 can also absorb the impact force generated when the upper mold 401 and the lower mold 402 are closed, thereby preventing the impact force from acting on the semiconductor element 12.

Figure 10:
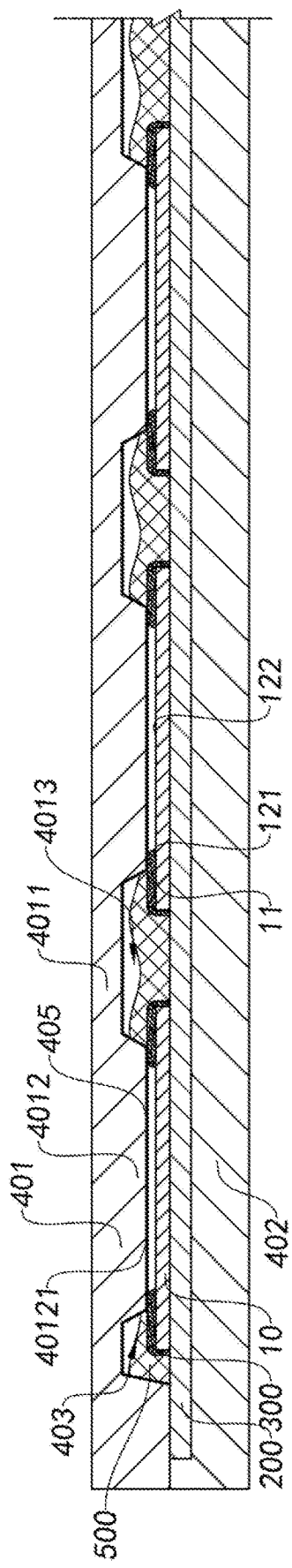
FIG. 10 is a schematic cross-sectional view of step 3 of the packaging method according to the above-mentioned preferred embodiment of the present invention, illustrating a state in which a forming material in fluid form is introduced into each forming space of the forming mold.
Figure 11:
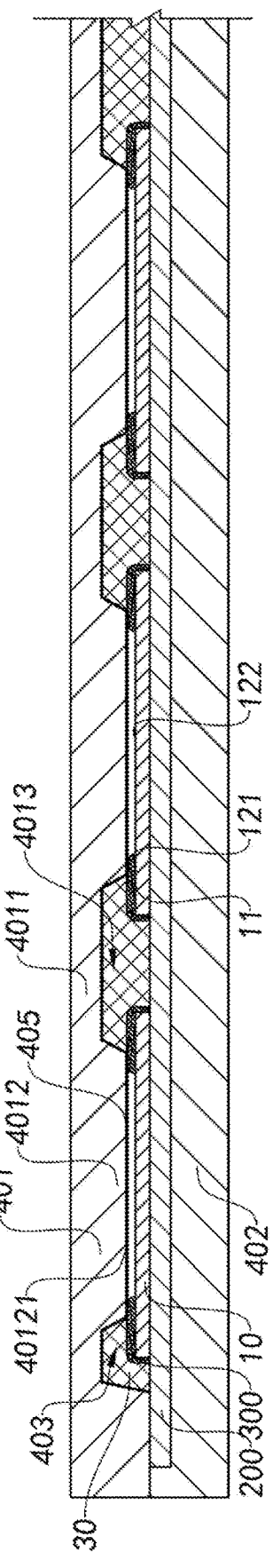
FIG. 11 is a schematic cross-sectional view of step 4 of the packaging method according to the above-mentioned preferred embodiment of the present invention, illustrating a state in which the forming material fills up each forming space of the forming mold.

Referring to FIG. 10 and FIG. 11, a forming material 500 in fluid form is introduced into the at least one forming space 403 of the forming mold 400. The forming material 500 fills up all the forming spaces 403 by means of the communication channel 404. In this case, the forming material 500 embeds the first adjoining surface 11 of the semiconductor element 10, and the compensation part 20 can isolate the first adjoining surface 11 of the semiconductor element 10 from at least a portion of a bonding region of the forming material 500.

After the forming material 500 fills up the forming space 403 of the forming mold 400, the forming material 500 may be cured in the forming space 403 of the forming mold 400, to form the packaging component 30 integrally encapsulated to the semiconductor element 10. In addition, an opening 31 of the packaging component 30 is formed at a position corresponding to the opening forming portion 4012 of the upper mold 401, where the opening 31 of the packaging component 30 corresponds to at least a portion of the non-adjoining surface 12 of the semiconductor element 10.

For example, in an example of the packaging method of the present invention, the forming material 500 that fills up the forming space 403 of the forming mold 400 may be cured by heating, to form the packaging component 30 integrally encapsulated to the semiconductor element 10.

The surface of the packaging component 30 that corresponds to the first adjoining surface 11 of the semiconductor element 10 is defined as a second adjoining surface 32, that is, a region where the first adjoining surface 11 of the semiconductor element 10 and the second adjoining surface 32 of the packaging component 30 are located is a bonding region between the semiconductor element 10 and the packaging component 30, where the compensation part 20 is located on at least a portion of the bonding region between the semiconductor element 10 and the packaging component 30.

It should be noted that, the type of the forming material 500 is not limited in the packaging method of the present invention. For example, the forming material 500 may be a liquid, solid particles, or a mixture of a liquid and solid particles, or any other material that can flow. In addition, after being introduced into the forming space 403 of the forming mold 400, the forming material 500 can be cured by heating, pressurization, cooling, radiation and so on. Preferably, the forming material 500 is implemented as, but not limited to, a thermosetting material.

Figure 12:
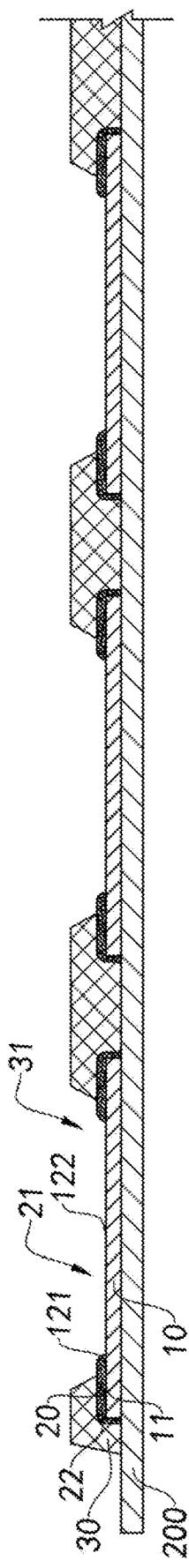
FIG. 12 is a schematic cross-sectional view of step 5 of the packaging method according to the above-mentioned preferred embodiment of the present invention, illustrating a state in which the forming mold has been removed.

After the forming material 500 is cured in the forming space 403 of the forming mold 400 to form the packaging component 30 integrally encapsulated to the semiconductor element 10, the forming mold 400 is drafted, to form semi-finished products of a plurality of semiconductor devices connected to each other as shown in FIG. 12.

Figure 13:
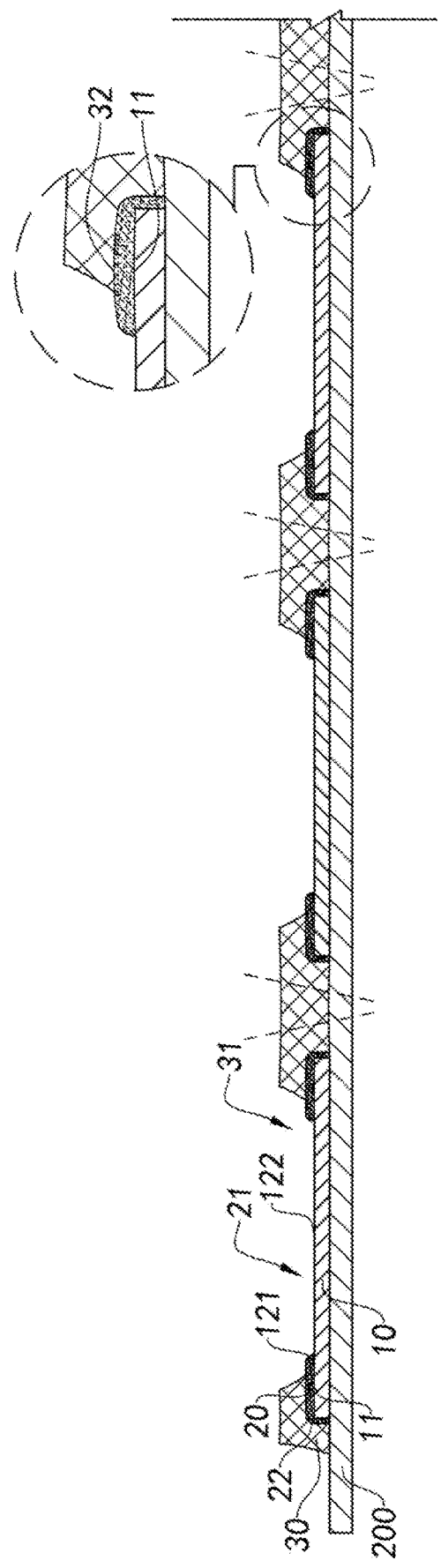
FIG. 13 is a schematic cross-sectional view of step 7 of the packaging method according to the above-mentioned preferred embodiment of the present invention, illustrating a state of magnitudes of deformation of a packaging component, a compensation part, and the semiconductor element that form the semiconductor device in a baking process.

Next, a baking process is carried out for the semi-finished products of the semiconductor devices, to further cure the packaging component 30, thereby preventing the packaging component 30 from falling off from the semiconductor element 10. Specifically, referring to FIG. 13, because the semiconductor element 10 and the packaging component 30 are made of different materials, the semiconductor element 10 and the packaging component 30 have different thermal expansion coefficients. In addition, because the packaging component 30 is molded by using the forming mold 400, the semiconductor element 10 and the packaging component 30 undergo different degrees of deformation when the semi-finished products of the semiconductor devices are baked to harden the packaging component 30, and the degree of deformation of the packaging component 30 is far greater than that of the semiconductor element 10.

Generally, according to the physical phenomenon of thermal expansion and contraction, the semiconductor element 10 slightly expands when being heated. Specifically, the first adjoining surface 11 of the semiconductor element 10 deforms upward in a direction toward the second adjoining surface 12 of the packaging component 30. The packaging component 30 deforms inwardly when being heated. Specifically, the second adjoining surface 12 of the packaging component 30 deforms inward in a direction away from the first adjoining surface 11 of the semiconductor element 10. When the packaging component 30 deforms inwardly at the position of the second adjoining surface 12, the packaging component 30 generates a pull force to pull the compensation part 20. When the semiconductor element 10 deforms outwardly at the position of the first adjoining surface 11, the semiconductor element 10 generates a pressing force to press the compensation part 20. The compensation part 20 is a deformable elastic member. The compensation part 20 can undergo different extent of deformation at different positions. Therefore, when the packaging component 30 pulls the compensation part 20 and the semiconductor element 10 presses the compensation part 20, different extent of deformations are caused at different positions of the compensation part 20 to compensate for a difference between the extent of deformation of the packaging component 30 and the extent of deformation of the semiconductor element 10, to prevent a pull force generated by contraction of the packaging component 30 from acting on the semiconductor element 10. This manner can prevent the semiconductor element 10 from experiencing a large extent of deformation, so as to avoid deformation and cracking of the semiconductor element 10, thereby ensuring good electrical properties of the semiconductor element 10. Especially for the semiconductor element 10 used for photosensitive, the flatness and intactness of the non-adjoining surface 12 of the semiconductor element 10 can be well ensured, thereby improving the electrical properties of the semiconductor element 10.

Figure 14:
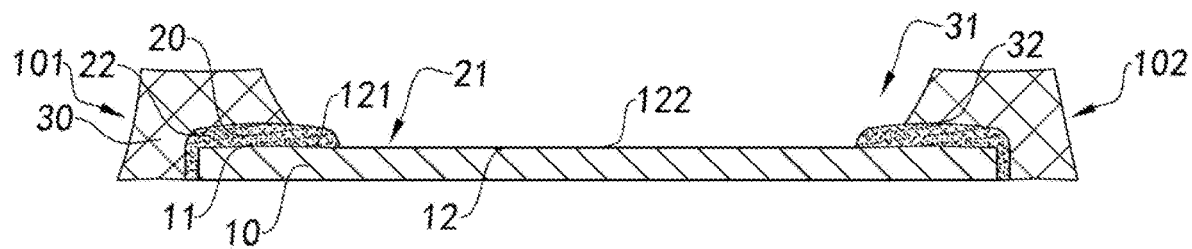
FIG. 14 is a schematic cross-sectional view of step 6 of the packaging method according to the above-mentioned preferred embodiment of the present invention, illustrating a schematic cross-sectional view of a semiconductor device formed after a cutting process.

Then, after the baking, the semi-finished products of the plurality of semiconductor devices connected to each other may be separated, to form the semiconductor devices, as shown in FIG. 14.

It should be noted that, the manner in which the semi-finished products of the semiconductor devices that are connected to each other are separated is not limited in the packaging method of the present invention. For example, in one example, the plurality of semiconductor devices connected to each other may be separated by using a cutting blade; in another example, the plurality of semiconductor devices connected to each other may be separated by etching.

In addition, the direction along which the semi-finished products of the semiconductor devices are separated may also not be limited. For example, the semi-finished products of the semiconductor devices may be separated from top to bottom to form the semiconductor devices, or may be separated from bottom to top to form the semiconductor devices.

It should be understood by those skilled in the art that, in other examples of the packaging method of the present invention, the semi-finished products of the plurality of semiconductor devices connected to each other may be separated first, and then the semi-finished products of the separate semiconductor devices are baked to obtain the semiconductor devices.

It should also be understood by those skilled in the art that, in some examples of the semiconductor device of the present invention, the semiconductor device has at least one demolding side 101, where after the baking process, the packaging component 30 deforms inwardly on the demolding side 101 of the semiconductor device, so that the packaging component 30 is arc-shaped on the demolding side 101 of the semiconductor device. In some other examples of the semiconductor device of the present invention, the semiconductor device has at least one separating side 102, where after the baking process, the semi-finished products of the semiconductor devices are separated, and the separating side 102 of the semiconductor device is formed at the position of separating. The packaging component 30 may be in the form of an intact flat surface, for example, an intact chamfer, on the separating side 102 of the semiconductor device.

That is to say, according to another aspect of the present invention, referring to FIG. 14, the present invention further provides a semiconductor device. The semiconductor device includes at least one semiconductor element 10, at least one compensation part 20, and at least one packaging component 30. The semiconductor element 10 has a first adjoining surface 11. The compensation part 20 is disposed in an overlapping manner on at least a portion of the first adjoining surface 11 of the semiconductor element 10, or the compensation part 20 is formed on at least a portion of the first adjoining surface 11 of the semiconductor element 10. The packaging component 30 is integrally encapsulated to the semiconductor element 10 by using a molding process, and the packaging component 30 has a second adjoining surface 32 formed at a position corresponding to the first adjoining surface 11 of the semiconductor element 10. When the packaging component 30 is integrally encapsulated to the semiconductor element 10 by using the molding process, a semi-finished product of the semiconductor device is formed. When the semi-finished product of the semiconductor device is baked, the compensation part 20 undergoes different extent of deformations at different positions to compensate for a difference between an extent of deformation of the packaging component 30 and an extent of deformation of the semiconductor element 10, to prevent a pull force generated by contraction of the packaging component 30 from acting on the semiconductor element 10, thereby ensuring reliability of the semiconductor element 10.

Preferably, the compensation part 20 has at least one through hole 21, where the through hole 21 corresponds to at least a portion of the non-adjoining surface 12 of the semiconductor element 10. The packaging component 30 has at least one opening 31, where the opening 31 of the packaging component 30 corresponds to at least a portion of the non-adjoining surface 12 of the semiconductor element 10 by means of the through hole 21 of the compensation part 20.

It should be noted that, the shape and size of the through hole 21 of the compensation part 20 and the shape and size of the opening 31 of the packaging component 30 are not limited in the semiconductor device of the present invention. Preferably, the shape of the through hole 21 of the compensation part 20 and the shape of the opening 31 of the packaging component 30 are implemented as a quadrangle such as a square or rectangle.

Figure 15:
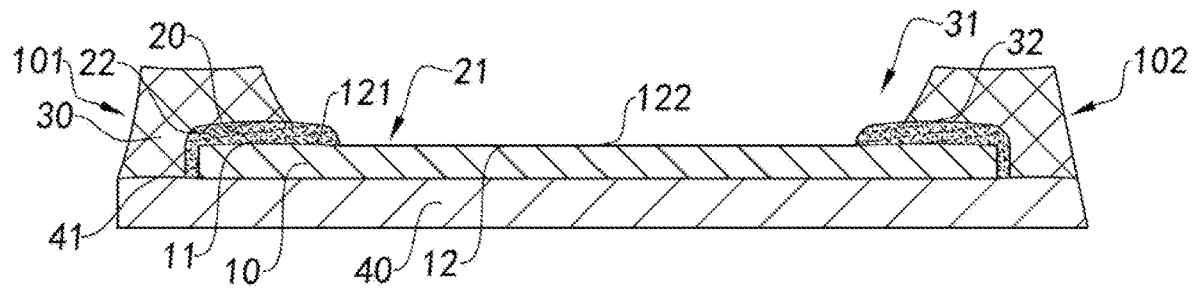
FIG. 15 is a schematic cross-sectional view of a semiconductor device according to another preferred embodiment of the present invention.

FIG. 15 illustrates a variant implementation of the semiconductor device, where the semiconductor device further includes a encapsulated component 40, and the packaging component 30 formed by using the molding process can package the semiconductor element 10 with the encapsulated component 40, so that the semiconductor element 10, the encapsulated component 40, and the packaging component 30 are integrally bonded.

Specifically, before the molding process, and after the semiconductor element 10 is placed on the encapsulated component 40, the compensation part 20 is disposed in an overlapping manner on at least a portion of the first adjoining surface 11 of the semiconductor element 10, or the compensation part 20 is formed on at least a portion of the first adjoining surface 11 of the semiconductor element 10.

The packaging component 30 formed in the molding process can be integrally encapsulated to the semiconductor element 10 and the encapsulated component 40. The compensation part 20 located on the first adjoining surface 11 of the semiconductor element 10 can isolate the second adjoining surface 32 of the packaging component 30 from the first adjoining surface 11 of the semiconductor element 10. In addition, in the subsequent baking process, the compensation part 20 can undergo different extent of deformations at different positions to compensate for the difference between the extent of deformation of the packaging component 30 and the extent of deformation of the semiconductor element 10, to prevent a pull force generated by contraction of the packaging component 30 from acting on the semiconductor element 10, thereby ensuring reliability of the semiconductor element 10.

Preferably, the compensation part 20 may be disposed on at least a portion of an exposed region 41 of a top surface of the encapsulated component 40, or the compensation part 20 may be formed on at least a portion of the exposed region 41 of the top surface of the encapsulated component 40, so that the compensation part 20 can isolate the second adjoining surface 32 of the packaging component 30 from the exposed region 41 of the encapsulated component 40. In this way, in the subsequent baking process, the compensation part 20 can undergo different extent of deformations at different positions to compensate for a difference between the extent of deformation of the packaging component 30 and the extent of deformation of the encapsulated component 40, to prevent a pull force generated by contraction of the packaging component 30 from acting on the encapsulated component 40, thereby ensuring the flatness of the semiconductor element 10 by ensuring the flatness of the encapsulated component 40. For example, in a preferred example of the present invention, the compensation part 20 is provided or formed on the entire exposed region 41 of the encapsulated component 40.

It should be noted that, the exposed region 41 of the encapsulated component 40 involved the present invention refers to a region that is not covered by the semiconductor element 10 after the semiconductor element 10 is disposed on the top surface of the encapsulated component 40.

Figure 16:
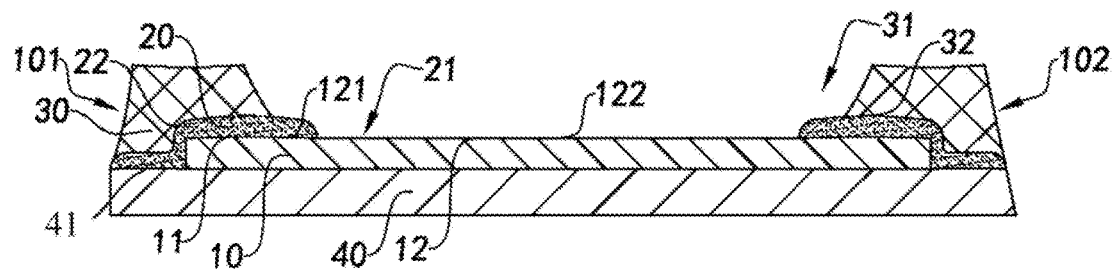
FIG. 16 is a schematic cross-sectional view of a semiconductor device according to another preferred embodiment of the present invention.

FIG. 16 illustrates another variant implementation of the semiconductor device, where the compensation part 20 may also be provided or formed between the packaging component 30 and the encapsulated component 40, so that in the subsequent baking process, the compensation part 20 deforms to compensate for the difference between the extent of deformation of the packaging component 30 and the extent of deformation of the encapsulated component 40, to prevent a pull force generated by contraction of the packaging component 30 from acting on the encapsulated component 40, thereby ensuring the reliability and yield of the semiconductor device.

Figure 17:
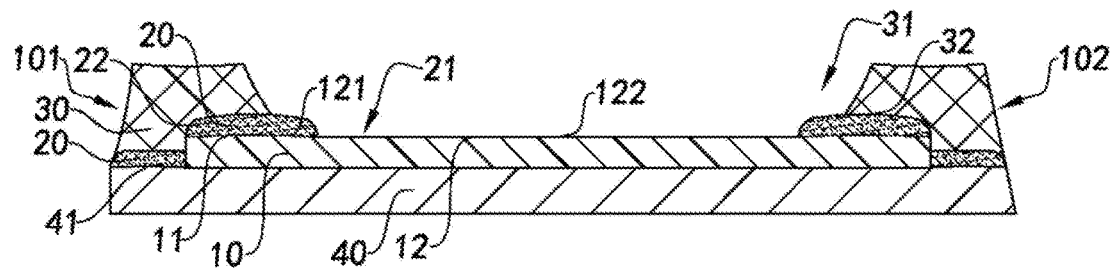
FIG. 17 is a schematic cross-sectional view of a semiconductor device according to another preferred embodiment of the present invention.
Figure 18:
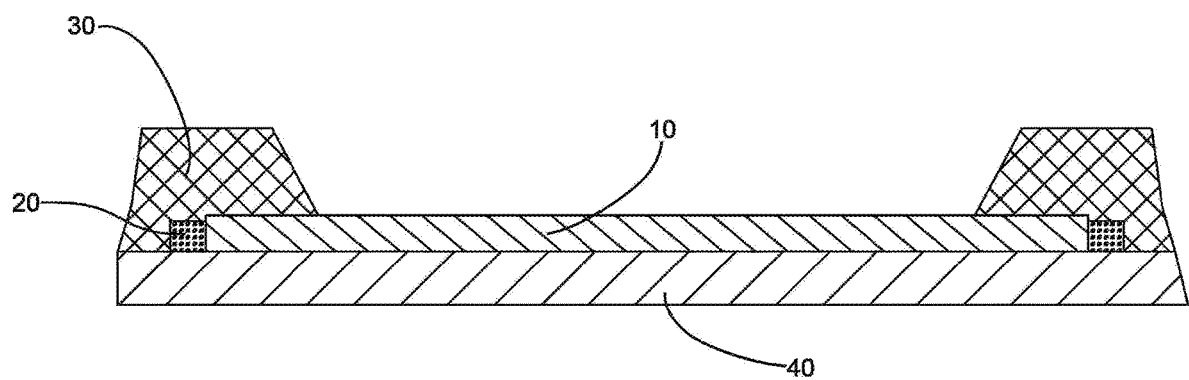
FIG. 18 is a schematic cross-sectional view of a semiconductor device according to another preferred embodiment of the present invention.

It should be noted that, in the example of the semiconductor device shown in FIG. 16, the compensation part 20 kept between the packaging component 30 and the encapsulated component 40 and the compensation part 20 kept between the packaging component 30 and the semiconductor element 10 may form an integral structure, that is, the compensation part 20 kept between the packaging component 30 and the encapsulated component 40 and the compensation part 20 kept between the packaging component 30 and the semiconductor element 10 may be integrally formed. In another variant implementation of the semiconductor device shown in FIG. 17, the compensation part 20 kept between the packaging component 30 and the encapsulated component 40 and the compensation part 20 kept between the packaging component 30 and the semiconductor element 10 may form a split-type structure, that is, the compensation part 20 kept between the packaging component 30 and the encapsulated component 40 and the compensation part 20 kept between the packaging component 30 and the semiconductor element 10 may be independent of each other, so that the compensation parts 20 respectively compensate for the difference between the extent of deformation of the packaging component 30 and the extent of deformation of the encapsulated component 40 and the difference between the extent of deformation of the packaging component 30 and the extent of deformation of the semiconductor element 10. Optionally, the compensation part 20 may be disposed only between the packaging component 30 and the encapsulated component 40, to compensate for deformation of the side surface of the semiconductor element caused by compression of the packaging component in the molding process, thereby reducing the image plane curvature, and improving the imaging quality. Disposing the compensation part 20 only between the packaging component 30 and the encapsulated component 40 can also conserve materials, reduce costs, and improve the production efficiency and yield. The present invention can reduce the deformation caused by different shrinkage factors of materials of various components. In the packaging method of the present invention, a light window is provided in the packaging component for imaging. Because the materials of various components have different shrinkage factors in the molding process of the packaging component, the packaging component provided with the light window more easily causes deformation of the semiconductor element than a packaging component having no light window. Disposing the compensation part 20 only between the packaging component 30 and the encapsulated component 40 according to the present invention can effectively reduce the deformation. FIG. 18 illustrates another variant implementation of the semiconductor device. As shown in FIG. 18, the compensation parts 20 may be disposed between the packaging component 30, the encapsulated component 40, and the semiconductor element 10, so that the compensation parts 20 can respectively compensate for the difference between the extent of deformation of the packaging component 30 and the extent of deformation of the encapsulated component 40 and the difference between the extent of deformation of the packaging component 30 and the extent of deformation of the semiconductor element 10. In the embodiment shown in FIG. 18, the compensation part 20 has a height less than that of the semiconductor element 10, the compensation part 20 is disposed only on a portion of a region, other than a portion of the region on which the semiconductor element 10 is located, of the encapsulated component 40. According to the above-mentioned configuration of the compensation part 20, the packaging component 30 may embed the encapsulated component 40, the semiconductor element 10 and the compensation part 20, and may be in contact with the encapsulated component 40, the semiconductor element 10, and the compensation part 20. According to the configuration of the compensation part in the embodiment shown in FIG. 18, the extent of deformation of the semiconductor element 10 can be effectively compensated for while conserving materials, reducing costs, and improving the production efficiency, so that the reliability of the semiconductor element 10 is ensured, thereby improving the product yield.

Figure 19:
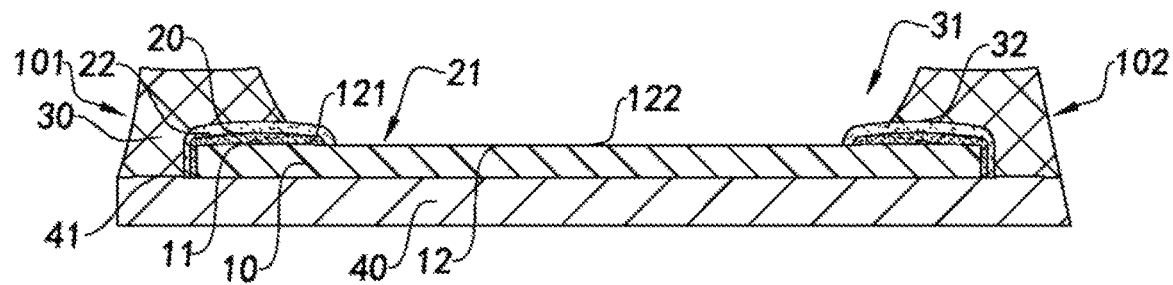
FIG. 19 is a schematic cross-sectional view of a semiconductor device according to another preferred embodiment of the present invention.

FIG. 19 illustrates another variant implementation of the semiconductor device, where the compensation part 20 may also be multi-layer. For example, in an embodiment, two glue layers may be overlapped with each other to form a multi-layer compensation part 20, or two ink layers may be overlapped with each other to form a multi-layer compensation part 20, that is, a multi-layer compensation part 20 may be formed by using one material. For another example, a glue layer and ink layer may be overlapped with each other to form a multi-layer compensation part 20, that is, a multi-layer compensation part 20 may be formed by using different materials. Definitely, different layers of the compensation part 20 may have different thicknesses. It should be understood by those skilled in the art that, although the formation of a multi-layer compensation part 20 by using a glue layer and ink layer is described in the present invention, in other examples, other materials may also be used to form a multi-layer compensation part 20, or the number of layers of the compensation part 20 may be more than two.

Figure 20:
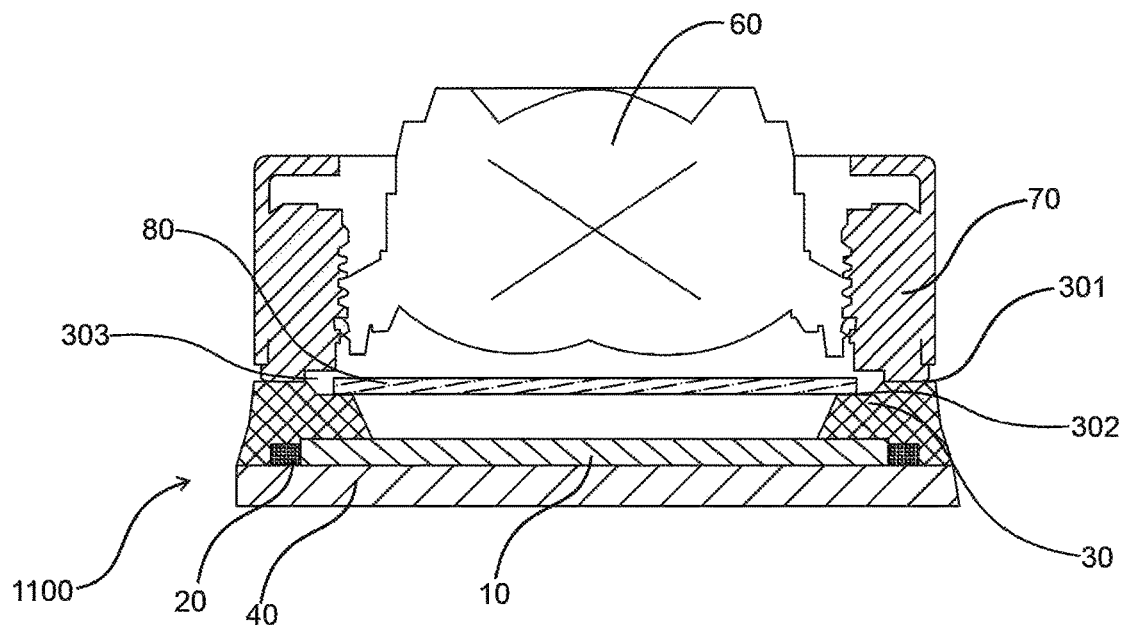
FIG. 20 is a schematic cross-sectional view of a camera apparatus including a semiconductor device according to a preferred embodiment of the present invention.

FIG. 20 is a schematic cross-sectional view of a camera apparatus 1100 including a semiconductor device according to a preferred embodiment of the present invention. As shown in FIG. 20, the camera apparatus 1100 includes an optical lens assembly 60 and the semiconductor device described above. The camera apparatus 1100 further includes a driver 70. The optical lens assembly 60 is drivably disposed on the driver 70. The driver 70 is mounted on a top surface of the packaging component 30, so that the optical lens assembly 60 is kept on a light path of the semiconductor element 10. In another implementation of the present invention, the camera apparatus 1100 may not include the driver 70. The camera apparatus 1100 shown includes a filter element 80, where the filter element 80 is mounted on the top surface of the packaging component 30, so that the filter element 80 is kept between the optical lens assembly 60 and the semiconductor element 10. In an alternative implementation, the camera apparatus 1100 shown includes a frame-shaped support, where the filter element 80 is mounted on the support, and the support is mounted on the top surface of the packaging component 30, so that the filter element 80 is kept between the optical lens assembly 60 and the semiconductor element 10. The top surface of the packaging component 30 has a first mounting region 301 and a second mounting region 302. The driver 70 is mounted on the first mounting region 301 of the packaging component 30, and the filter element 80 or the support is mounted on the second mounting region 302 of the packaging component 30. There is a height difference between the first mounting region 301 and the second mounting region 302 of the packaging component 30, so as to form a mounting groove 303 in communication with the opening, where the filter element 80 or the support is received in the mounting groove 303. The top surface of the packaging component 30 has a first mounting region 301 and a second mounting region 302. The driver is mounted on the first mounting region 301 of the packaging component 30, and the support is mounted on the second mounting region 302 of the packaging component 30. The camera apparatus 1100 shown includes a circuit board, where a chip connecting part of the semiconductor element 10 is conductively connected to a circuit board connecting part of the circuit board.

Figure 21:
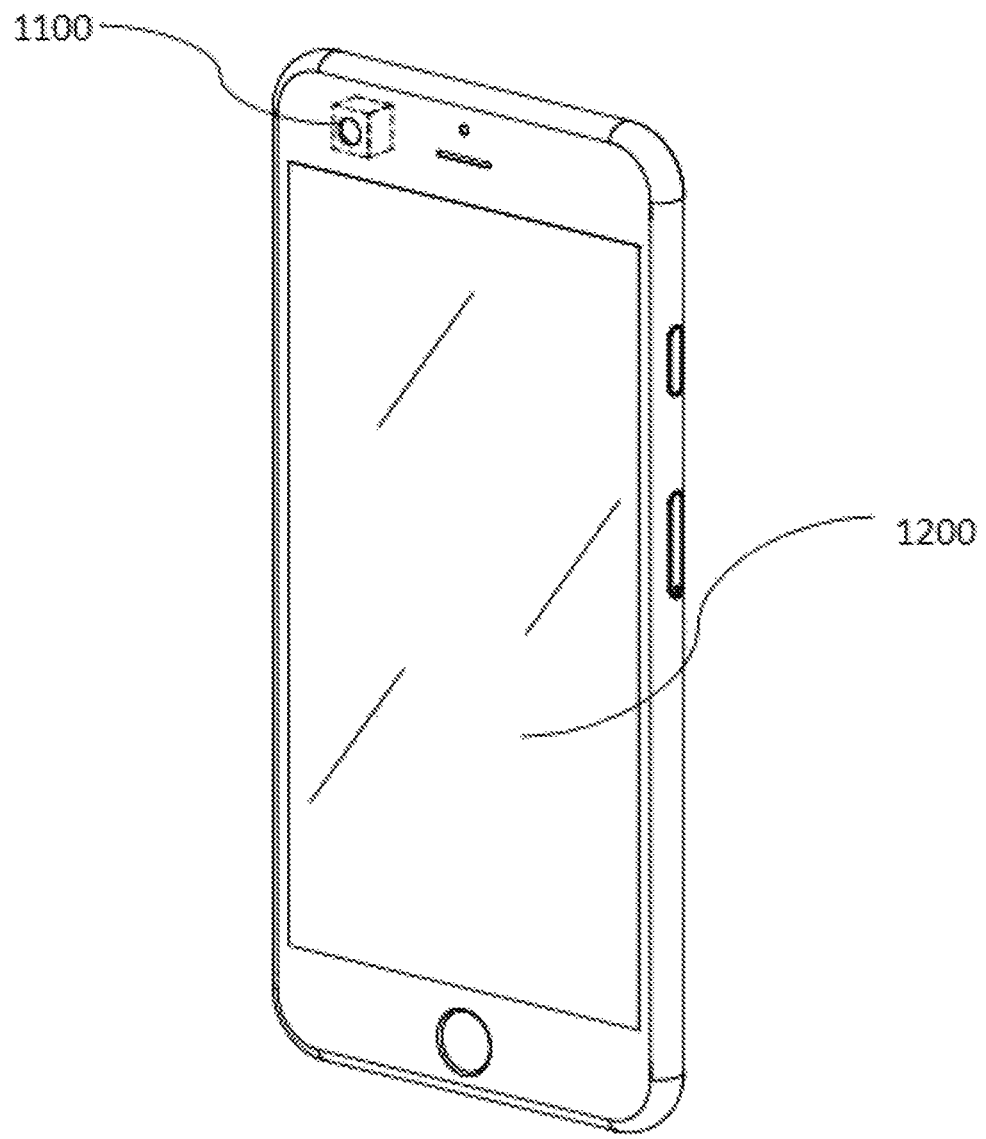
FIG. 21 illustrates an electronic device including a camera apparatus according to a preferred embodiment of the present invention.

FIG. 21 illustrates an electronic device including a camera apparatus according to a preferred embodiment of the present invention. The present invention further provides an electronic device. Referring to FIG. 21, the electronic device includes a device body 200 and a camera apparatus 1100. The camera apparatus 1100 is disposed on the device body 1200, to help the device body 1200 in photographing (for example, take a video or an image).

It should be noted that, the present invention provides a semiconductor packaging method based on a molding process, which is different from the existing molding and packaging technique. The packaging method includes the following steps:

(a) keeping at least a portion of the compensation part 20 on at least a portion of a bonding region formed between the first adjoining surface 11 of the semiconductor element 10 and the second adjoining surface 32 of the packaging component 30, to form a semi-finished product of a semiconductor device; and (b) during hardening of the packaging component 30, causing the compensation part 20 to undergo different degrees of deformation at different positions to compensate for a difference between an extent of deformation of the packaging component 30 and an extent of deformation of the semiconductor element 10, so as to package the semiconductor element 10 to form the semiconductor device.

It should be noted that, in the step (b), the packaging component 30 may be cured by using a baking process, so as to prevent the packaging component 30 from falling off from the semiconductor element 10.

It should be understood by those skilled in the art that the embodiments of the present invention that are described above and shown in the accompanying drawings are provided by way of example only, and are not intended to limit the present invention.

The objectives of the present invention have been completely and effectively achieved. The functional and structural principles of the present invention have already been presented and described in the embodiments, and any variation or modification can be made to the implementations of the present invention without departing from the principles.

What is claimed is:

1. A semiconductor packaging method based on a molding process, the packaging method comprising the following steps:
   (a) keeping at least a portion of a compensation part on at least a portion of a bonding region formed between a first adjoining surface of a semiconductor element and a second adjoining surface of a packaging component, to form a semi-finished product of a semiconductor device; and
   (b) causing the compensation part to undergo different degrees of deformation at different positions to compensate for a difference between an extent of deformation of the packaging component and an extent of deformation of the semiconductor element during hardening of the packaging component, so as to package the semiconductor element to form the semiconductor device.

2. The semiconductor packaging method according to claim 1, wherein in the step (a), semi-finished products of a plurality of semiconductor devices are connected to each other by the packaging component, and after the step (b), the packaging method further comprises the following step: (c) separating the semi-finished products of the plurality of semiconductor devices that are connected to each other.

3. The semiconductor packaging method according to claim 1, wherein in the step (a), semi-finished products of a plurality of semiconductor devices are connected to each other by the packaging component, and before the step (b), the packaging method further comprises the following step: (c) separating the semi-finished products of the plurality of semiconductor devices that are connected to each other.

4. The packaging method according to claim 1, wherein before the step (a), the packaging method further comprises the following steps: (d) disposing the semiconductor element on a encapsulated component in an overlapping manner, so that in the step (a), the packaging component, the semiconductor element, and the encapsulated component are integrally bonded in such a manner that at least a portion of the semiconductor element and at least a portion of the encapsulated component are embedded in the packaging component.

5. The packaging method according to claim 1, wherein the step (a) further comprises the following steps:

providing a jointed board unit, wherein the jointed board unit has at least one semiconductor element;

disposing the compensation part on the semiconductor element in such a manner that at least a portion of the compensation part is located on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

6. The packaging method according to claim 4, wherein the step (a) further comprises the following steps:

providing a jointed board unit, wherein the jointed board unit has at least one semiconductor element;

disposing the compensation part on the semiconductor element in such a manner that at least a portion of the compensation part is located on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

7. The packaging method according to claim 1, wherein the step (a) further comprises the following steps:

providing a jointed board unit, wherein the jointed board unit has at least one semiconductor element;

forming at least a portion of the compensation part on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

8. The packaging method according to claim 4, wherein the step (a) further comprises the following steps:

providing a jointed board unit, wherein the jointed board unit has at least one semiconductor element;

forming at least a portion of the compensation part on at least a portion of the first adjoining surface of the semiconductor element; and integrally bonding the packaging component to the semiconductor element at a position corresponding to the first adjoining surface of the semiconductor element by using a forming mold, so that at least a portion of the compensation part is kept on at least a portion of the bonding region between the first adjoining surface of the semiconductor element and the second adjoining surface of the packaging component.

9. The packaging method according to claim 5, wherein in the method, after the compensation part is disposed on a top surface of the semiconductor element, at least a portion of a side surface of the semiconductor element is automatically embedded in an outer embedding portion of the compensation portion.

10. The packaging method according to claim 5, wherein in the method, after the compensation part is disposed on a top surface of the semiconductor element, the molding process is performed by using the forming mold so that an outer embedding portion of the compensation part is pressed to enter into close contact with at least a portion of a side surface of the semiconductor element.

11. The packaging method according to claim 6, wherein in the method, after the compensation part is disposed on a top surface of the semiconductor element, at least a portion of an exposed region of the encapsulated component is automatically embedded in an outer embedding portion of the compensation part.

12. The packaging method according to claim 6, wherein in the method, after the compensation part is disposed on a top surface of the semiconductor element, the molding process is performed by using the forming mold so that an outer embedding portion of the compensation part is pressed to embed at least a portion of an exposed region of the encapsulated component.

13. The packaging method according to claim 8, wherein in the method, a portion of the compensation part is formed on an exposed region of the encapsulated component.

14. The packaging method according to claim 11, wherein in the method, the entire exposed region of the encapsulated component is embedded in the outer embedding portion of the compensation part.

15. The packaging method according to claim 5, wherein in the method, a film layer is provided between a pressure applying surface of the forming mold and a non-adjoining surface of the semiconductor element, so that the pressure applying surface of the forming mold and the non-adjoining surface of the semiconductor element are isolated by the film layer.

16. The packaging method according to claim 5, wherein in the method, a portion of the compensation part is extended from the first adjoining surface of the semiconductor element to at least a portion of a non-adjoining surface of the semiconductor element, so that a pressure applying surface of the forming mold and the non-adjoining surface of the semiconductor element are isolated by the portion of the compensation part in the molding process.

17. The packaging method according to claim 7, wherein in the method, a molding material is applied to at least a portion of the first adjoining surface of the semiconductor element, so as to form the compensation part after the molding material cures.

18. The packaging method according to claim 17, wherein in the method, a molding material is applied to at least a portion of the first adjoining surface and at least a portion of a non-adjoining surface of the semiconductor element, so as to form the compensation part after the molding material cures.

19. The packaging method according to claim 13, wherein in the method, a molding material is applied to at least a portion of the first adjoining surface of the semiconductor element and at least a portion of the exposed region of the encapsulated component, so as to form the compensation part after the molding material cures.

20. The packaging method according to claim 19, wherein in the method, the molding material is applied to at least a portion of a non-adjoining surface of the semiconductor element.

21. The packaging method according to claim 4, wherein the compensation part is provided or formed between the packaging component and the encapsulated component.

22. The packaging method according to claim 1, wherein the compensation part has a multi-layer structure.

* * * * *